United States Patent
Fulford et al.

(10) Patent No.: US 11,656,550 B2
(45) Date of Patent: May 23, 2023

(54) CONTROLLING SEMICONDUCTOR FILM THICKNESS

(71) Applicant: Tokyo Electron Limited, Tokyo (JP)

(72) Inventors: Daniel Fulford, Albany, NY (US);
Michael Murphy, Albany, NY (US);
Jodi Grzeskowiak, Albany, NY (US);
Jeffrey Smith, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 17/125,609

(22) Filed: Dec. 17, 2020

(65) Prior Publication Data
US 2022/0066317 A1    Mar. 3, 2022

Related U.S. Application Data

(60) Provisional application No. 63/073,047, filed on Sep. 1, 2020.

(51) Int. Cl.
*G03F 7/004*      (2006.01)
*G03F 7/11*      (2006.01)
(Continued)

(52) U.S. Cl.
CPC ............ *G03F 7/0045* (2013.01); *G03F 7/094* (2013.01); *G03F 7/11* (2013.01); *G03F 7/32* (2013.01);
(Continued)

(58) Field of Classification Search
CPC ...... G03F 7/0035; G03F 7/0045; G03F 7/094; G03F 7/11; G03F 7/2022; G03F 7/32;
(Continued)

(56) References Cited

U.S. PATENT DOCUMENTS 10,061,199 B2 *   8/2018   deVilliers ............... G03F 7/405
2007/0138699 A1    6/2007   Wuister et al.
(Continued)

FOREIGN PATENT DOCUMENTS

EP            1743219 B1    12/2015
JP            2022099428 A *   7/2022
(Continued)

OTHER PUBLICATIONS

Samer Banna and Ankur Agarwal, Pulsed high-density plasmas for advanced dry etching processes, 2012, Journal of Vacuum Science & Technology A, vol. 30, Issue 4 (Year: 2012).*
(Continued)

*Primary Examiner* — Pamela H Weiss
*Assistant Examiner* — Alexander Nicholas Lee
(74) *Attorney, Agent, or Firm* — Slater Matsil, LLP

(57) ABSTRACT

In certain embodiments, a method for processing a semiconductor substrate includes depositing a resin film on a substrate that has microfabricated structures defining recesses. The resin film fills the recesses and covers the microfabricated structures. The method includes performing, using a photoacid generator (PAG)-based process, a localized removal of the resin film to remove the resin film to respective first depths in the recesses, at least two depths of the respective first depths being different depths. The method includes repeatedly performing, using a thermal acid generator (TAG)-based process and until a predetermined condition is met, a uniform removal of a remaining portion of the resin film to remove a substantially uniform depth of the resin film in the recesses.

21 Claims, 25 Drawing Sheets

CROSS-SECTIONAL VIEW

PLAN VIEW

(51) Int. Cl.
*H01L 21/311* (2006.01)
*G03F 7/09* (2006.01)
*G03F 7/32* (2006.01)
*G03F 7/38* (2006.01)

(52) U.S. Cl.
CPC .......... *G03F 7/38* (2013.01); *H01L 21/31133* (2013.01)

(58) Field of Classification Search
CPC ... G03F 7/38; H01L 21/0271; H01L 21/0337; H01L 21/31133
See application file for complete search history.

(56) References Cited

U.S. PATENT DOCUMENTS

| | | | |
|---|---|---|---|
| 2009/0274980 A1* | 11/2009 | Kang | G03F 7/0035 430/311 |
| 2010/0015550 A1* | 1/2010 | Liu | C08F 222/14 430/319 |
| 2010/0255429 A1 | 10/2010 | Ishikawa et al. | |
| 2010/0291490 A1* | 11/2010 | Tsuruda | H01L 21/67155 430/325 |
| 2012/0273924 A1* | 11/2012 | Matsuda | G03F 7/2041 257/632 |
| 2013/0115559 A1 | 5/2013 | Bae et al. | |
| 2016/0049306 A1* | 2/2016 | Koh | H01L 21/31144 438/745 |
| 2016/0300756 A1* | 10/2016 | Somervell | H01L 21/02164 |
| 2017/0255103 A1* | 9/2017 | Rowell | H01L 21/0274 |
| 2017/0330806 A1 | 11/2017 | deVilliers et al. | |
| 2018/0118968 A1 | 5/2018 | Kaur et al. | |
| 2018/0188654 A1 | 7/2018 | Rowell et al. | |
| 2018/0366538 A1 | 12/2018 | Millward et al. | |
| 2019/0051518 A1 | 2/2019 | Shigaki et al. | |
| 2019/0204742 A1 | 7/2019 | Lee et al. | |
| 2019/0341253 A1 | 11/2019 | Ibata et al. | |
| 2020/0152472 A1 | 5/2020 | deVilliers et al. | |
| 2021/0294148 A1* | 9/2021 | Grzeskowiak | G03F 7/094 |

FOREIGN PATENT DOCUMENTS

| | | |
|---|---|---|
| KR | 20080033196 A | 4/2008 |
| WO | 2016209905 A1 | 12/2016 |

OTHER PUBLICATIONS

Zhiyong Yang, Anatoly Y. Burov, Lifeng Duan, Fan Wang; "Multifeature focus exposure matrix for tool diagnosis", 2011, Proceedings of SPIE, vol. 7971 (1), p. 79712N-79712N-9 (Year: 2011).*

Arimitsu, K et al., "Acid-amplifying polymers: synthesis, characterization, and application to environmentally stable chemical amplification positive (ESCAP) resists", https://doi.org/10.1039/C5RA15423E, RSC Advances, Issue 98, Sep. 14, 2015, 5 pages.

Brainard, R et al., "Kinetics, Chemical Modeling and Lithography of Novel Acid Amplifiers for Use in EUV Photoresists", Journal of Photopolymer Science and Technology, vol. 22, No. 1, 8 pages, 2009.

Burns, S et al., "Determining Free Volume Changes During the PEB and PAB of a Chemically Amplified Resist", 2000, 12 pages.

Wang, M et al., "Novel Anionic Photoacid Generators (PAGs) and Corresponding PAG Bound Polymers", https://doi.org/10.1002/marc.200600330, Macromolecular Rapid Communications, vol. 27, Issue 18, Sep. 25, 2006, 4 pages.

International Searching Authority, Notification of Transmittal of the International Search Report and the Written Opinion of the International Searching Authority, or the Declaration, dated Nov. 2, 2021, International application PCT/US2021/040788, 9 pages.

* cited by examiner

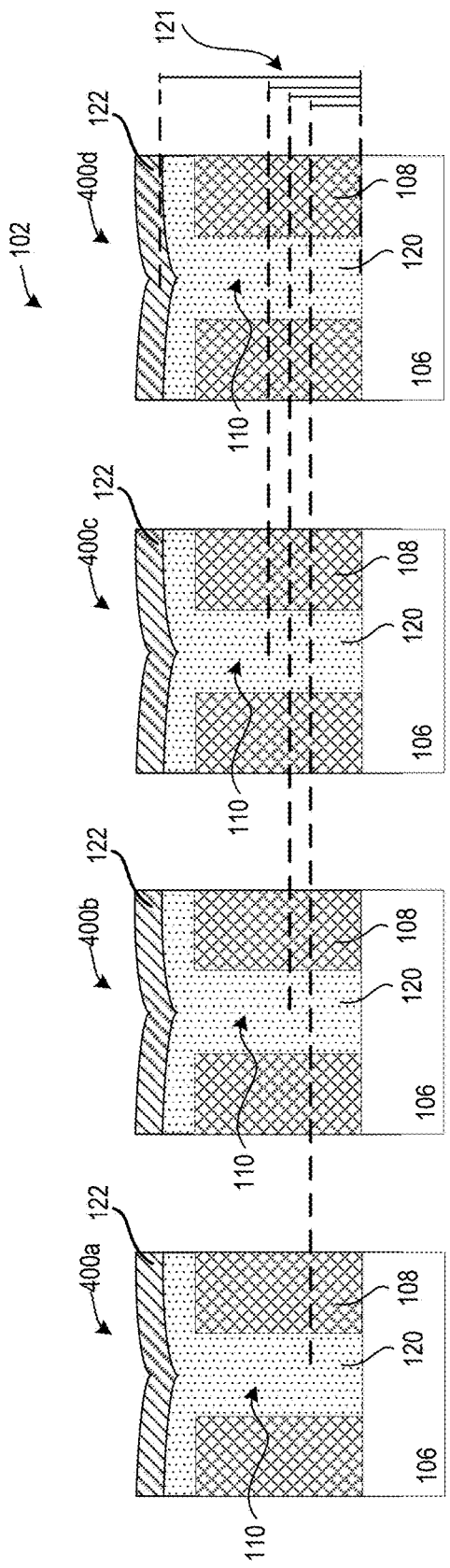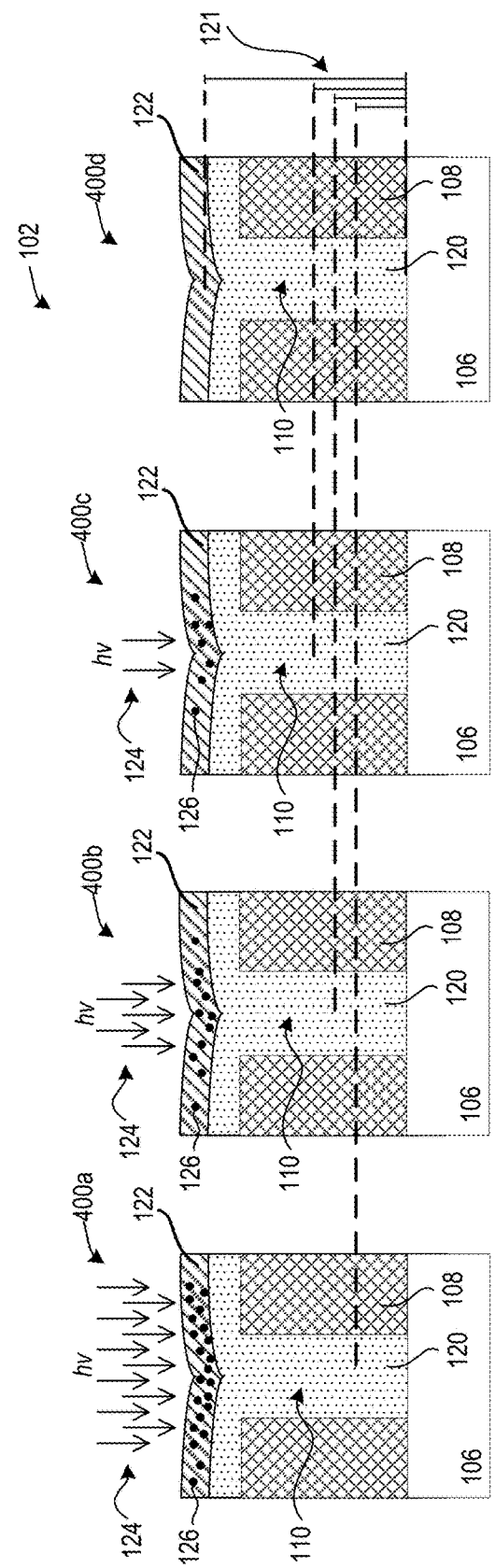

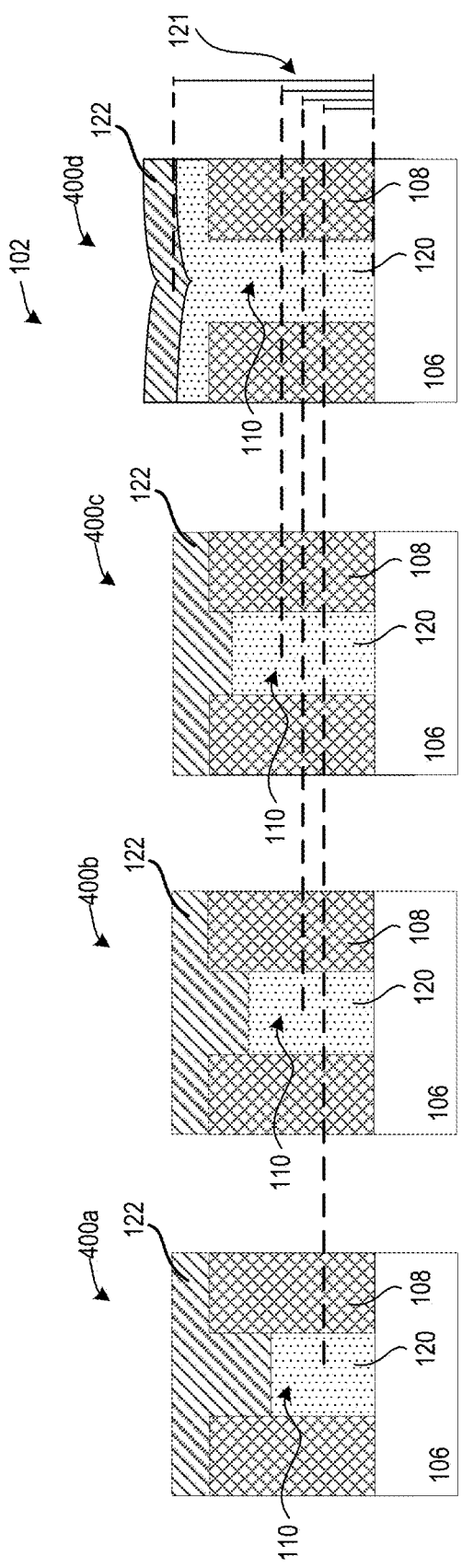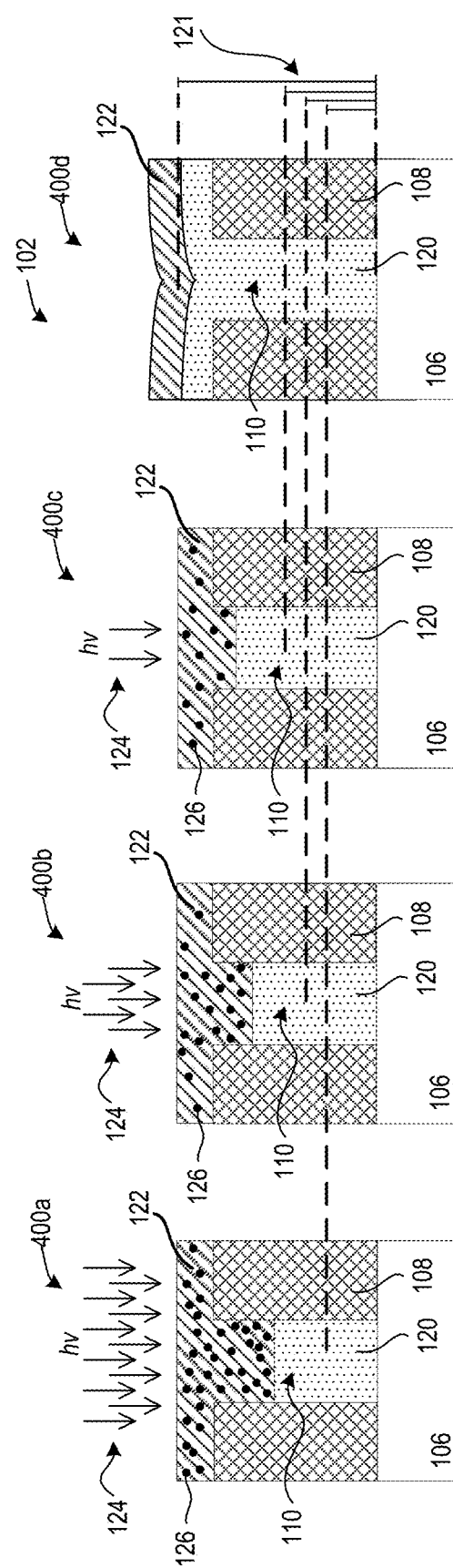

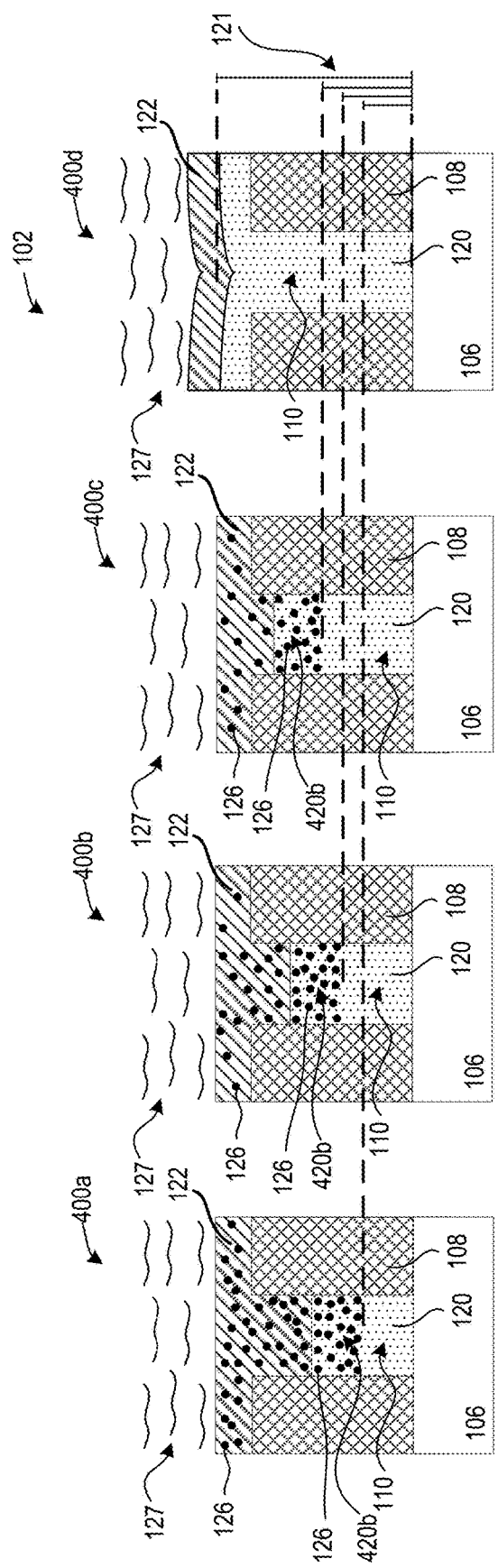
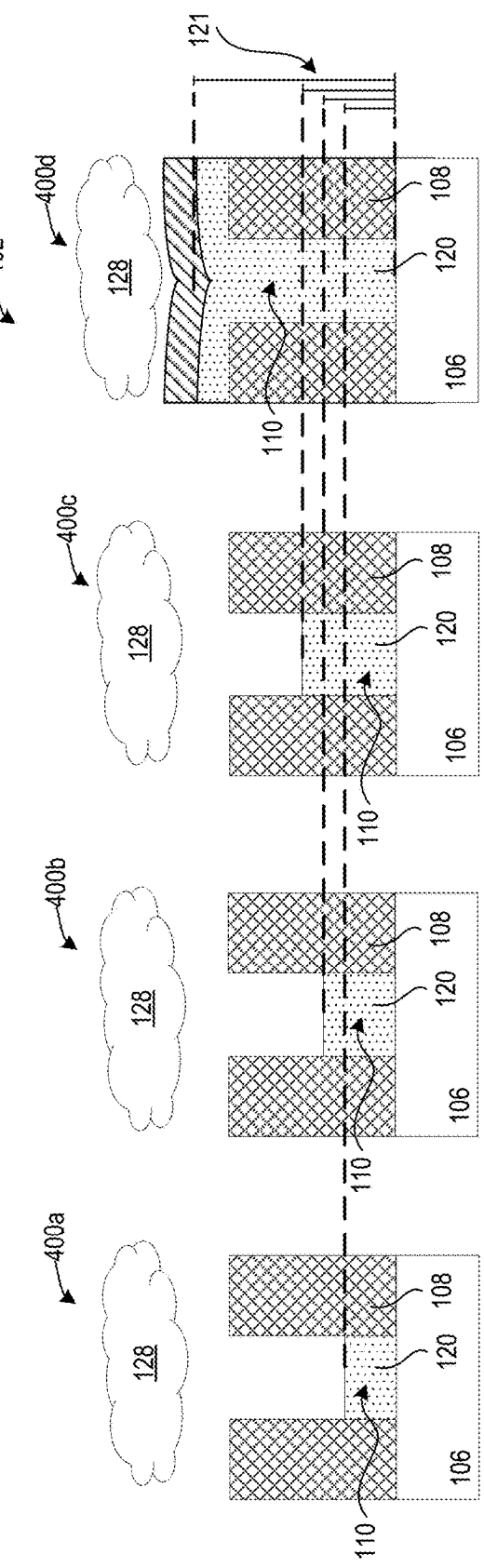
FIGURE 4G
FIGURE 4H

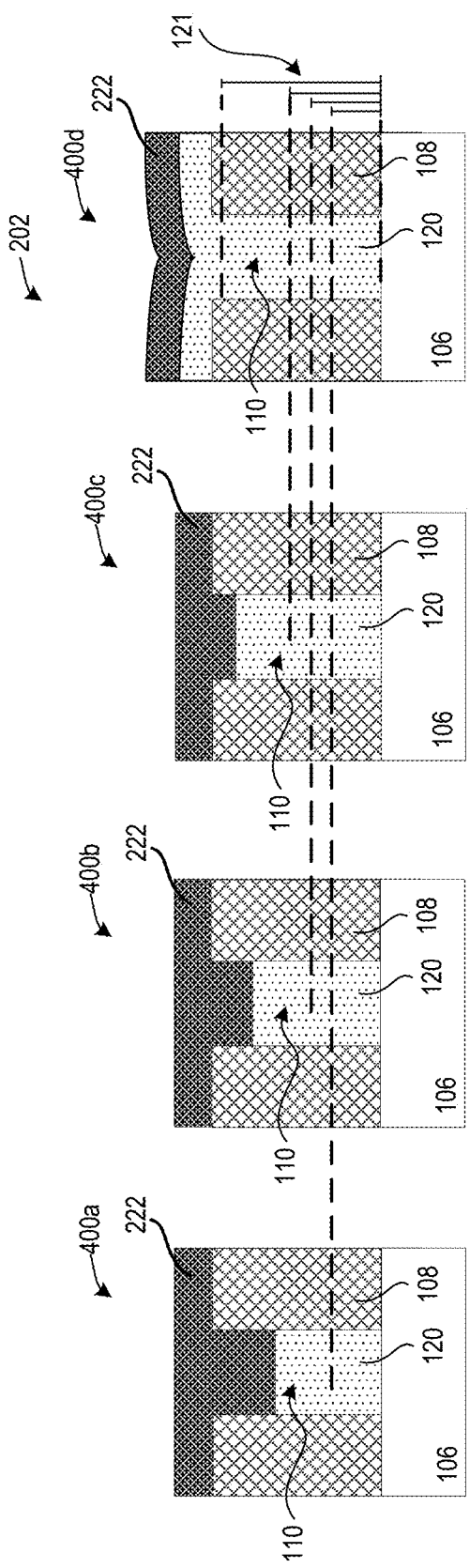
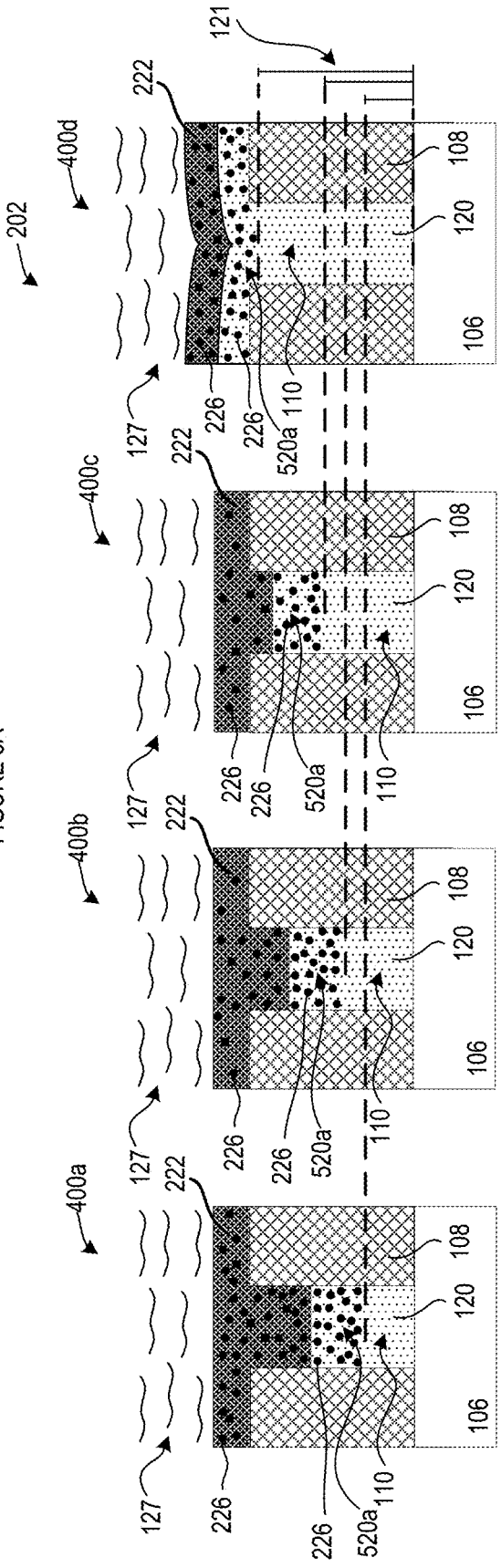
FIGURE 5A
FIGURE 5B

TAGs

CONTROLLING SEMICONDUCTOR FILM THICKNESS

CROSS-REFERENCE TO RELATED APPLICATIONS

This application claims the benefit of U.S. Provisional Application No. 63/073,047, filed on Sep. 1, 2020, which is incorporated by reference.

TECHNICAL FIELD

This disclosure relates generally to semiconductor fabrication, and, in certain embodiments, to controlling semiconductor film thickness.

BACKGROUND

Constructing electrical circuits involves depositing numerous layered materials across various features or structures, as well as patterning, etch, and fill processes. As design innovation for next generation transistors moves to smaller dimensions and vertical architectures, desire for technology that precisely controls film thickness within a die and across a wafer increases. Etch processes can be timed to remove a portion of a film without an endpoint; however, such processes have poor locational control and high variability.

SUMMARY

In certain embodiments, a method for processing a semiconductor substrate includes receiving a substrate having microfabricated structures defining recesses and depositing a resin film on the substrate. The resin film fills the recesses, covers the microfabricated structures, and is initially resistant to development by a solvent. The method includes depositing a first overcoat film on the substrate. The first overcoat film contains a first agent-generating ingredient that generates, in response to actinic radiation, a first solubility-changing agent. The method includes exposing the first overcoat film to first sufficient actinic radiation to generate the first solubility-changing agent within the first overcoat film. The method includes diffusing the first solubility-changing agent a first predetermined depth into the resin film causing a first portion of the resin film to become soluble to the first solvent, and developing the first overcoat film and the first portion of the resin film using the first solvent. The method includes depositing a second overcoat film on the substrate. The second overcoat film contains the first agent-generating ingredient that generates, in response to actinic radiation, the first solubility-changing agent. The method includes exposing the second overcoat film to second sufficient actinic radiation to generate the first solubility-changing agent within the second overcoat film. The method includes diffusing the first solubility-changing agent a second predetermined depth into the resin film causing a second portion of the resin film to become soluble to the first solvent, and developing the second overcoat film and the second portion of the resin film using the first solvent resulting in the resin film being recessed respective first combined depths in the recesses.

In certain embodiments, a method for processing a semiconductor substrate includes receiving a substrate having microfabricated structures defining recesses and depositing a resin film on the substrate. The resin film fills the recesses, covers the microfabricated structures, and is initially resistant to development by a first solvent. The method includes depositing a first overcoat film on the substrate. The first overcoat film contains a first agent-generating ingredient that generates, in response to actinic radiation, a first solubility-changing agent. The method includes exposing the first overcoat film to sufficient actinic radiation to generate the first solubility-changing agent within the first overcoat film. The method includes diffusing the first solubility-changing agent a first predetermined depth into the resin film causing a first portion of the resin film to become soluble to the first solvent, and developing the first portion of the resin film using the first solvent. The method includes depositing a second overcoat film on the substrate. The second overcoat film contains a second agent-generating ingredient that generates, in response to heating of the substrate, a second solubility-changing agent. The method includes baking the substrate sufficiently to generate the second solubility-changing agent within the second overcoat film and diffuse the second solubility-changing agent a second predetermined depth into the resin film causing a second portion of the resin film to become soluble to the first solvent. The method includes developing the second portion of the resin film using the first solvent resulting in the resin film being recessed respective combined depths in the recesses.

In certain embodiments, a method for processing a semiconductor substrate includes depositing a resin film on a substrate that has microfabricated structures defining recesses. The resin film fills the recesses and covers the microfabricated structures. The method includes performing, using a photoacid generator (PAG)-based process, a localized removal of the resin film to remove the resin film to respective first depths in the recesses, at least two depths of the respective first depths being different depths. The method includes repeatedly performing, using a thermal acid generator (TAG)-based process and until a predetermined condition is met, a uniform removal of a remaining portion of the resin film to remove a substantially uniform depth of the resin film in the recesses.

BRIEF DESCRIPTION OF THE DRAWINGS

For a more complete understanding of this disclosure, and the advantages thereof, reference is now made to the following descriptions taken in conjunction with the accompanying drawings, in which:

FIGS. 4A-4H illustrate cross-sectional views of example substrate portions having pre-patterned features during example process for processing the substrate portions;

FIGS. 5A-5C illustrate cross-sectional views of example substrate portions having pre-patterned features during portions of example process for processing the substrate portions;

DETAILED DESCRIPTION OF ILLUSTRATIVE EMBODIMENTS

Figure 1A:
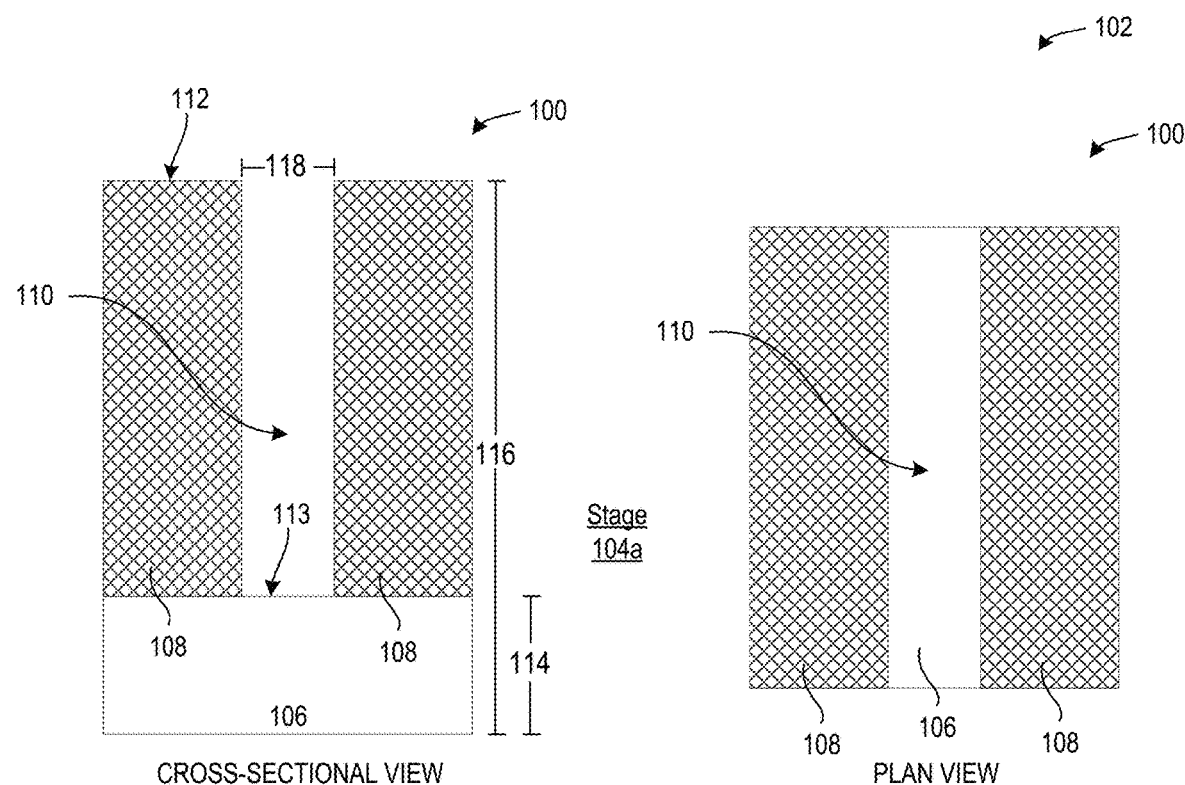
FIGS. 1A-1J illustrate cross-sectional and plan views of an example semiconductor substrate during an example process for processing the substrate.

Throughout the deposition, patterning, and removal processes associated with forming a semiconductor device, it may be desirable to control the height of a deposited film for various reasons. For example, it may be desirable to remove a portion of a deposited film (e.g., in a trench) to achieve a certain height of that deposited film within the trench. Conventional removal processes, such as timed wet or dry etch processes, for removing portions of a deposited layer are often difficult to control and suffer other problems, such as planarization problems. These problems become even more prevalent as feature sizes continue to shrink or vary across the surface of a semiconductor wafer being processed.

Embodiments of this disclosure provide techniques to control film thickness for a semiconductor substrate. The substrate may have pre-patterned features that include, for example, structures defining recesses. The film being controlled may be a fill material, such as a polymer resin, deposited over the pre-patterned features, filling the recesses and covering the structures. Across a semiconductor wafer that includes the substrate, precisely and repeatably reducing the fill material to particular target heights (thicknesses) within recesses may be desired, and those target heights might vary from among recesses. Certain embodiments accomplish this film thickness control without using an etch stop layer or other timed etch process used with conventional etch techniques in which control of film height is desired.

The fill material may be initially resistant to removal (e.g., development) by a solvent (e.g., developer) to be used in removing a portion of the fill material. Certain embodiments use a cyclic process that includes depositing an overcoat film containing an agent-generator that, in response to a stimulus, generates an agent in the overcoat film. The agent is then diffused into the fill material to a predetermined depth, causing a portion of the fill material to become de-protected (removable/developable) relative to the solvent. The overcoat film and the de-protected portion of the fill material are then removed using the solvent. This process can be repeated until the fill material in the recesses reaches one or more corresponding target heights.

Certain embodiments use a PAG-based process to reduce at least a portion of a height of a resin film in recesses of a substrate. For example, the agent-generator in the overcoat film may be a photo-activated agent generator (e.g., a PAG) that is activated in response to actinic radiation. This PAG-based process may be repeated a suitable number of times until target films heights (e.g., within recesses) are achieved.

Certain embodiments use a TAG-based process to reduce at least a portion of a height of a resin film in recesses of a substrate. For example, the agent-generator in the overcoat film may be a thermally-activated agent generator (e.g., a TAG) that is activated in response to heat. This TAG-based process may be repeated a suitable number of times until target films heights (e.g., within recesses) are achieved.

Certain embodiments combine one or more iterations of the PAG-based process to establish height variations in the resin film with one or more iterations of the TAG-based process to uniformly further reduce the film height thickness until the target film heights (e.g., within recesses) are achieved.

That is, embodiments provide modulation of film thickness and profile by location across a wafer by generation and diffusion of acid from an overcoat into an acid-de-protectable resin, followed by development. Depth of the acid de-protection into the resin film may be defined by the amount of acid produced in, and diffused from, the overlying overcoat. Locational height control may be achieved using photoacid and/or thermal-acid generator containing overcoats. Embodiments can be used with backside overlay control techniques as well as location-based critical dimension optimizer platforms for front side treatment.

Certain embodiments also provide improved planarity. For example, certain conventional etch techniques introduce or exacerbate planarization problems, particularly as pitches between structures of a substrate, or the widths of those structures, vary. Certain embodiments of this disclosure are able to control removal of a fill material to target heights with little to no effects introduced by the varying topography of a substrate.

FIGS. 1A-1J illustrate cross-sectional and plan views of an example semiconductor substrate 100 during an example process 102 for processing substrate 100, according to certain embodiments. Process 102 includes stages 104a-104j, though process 102 may include more or fewer stages if appropriate. Substrate 100 may be part of a larger semiconductor device, such as part of a larger semiconductor wafer. In certain embodiments, process 102 includes repeatedly performing a PAG-based process to remove a fill material from a recess of substrate 100 until the fill material is a predetermined height within the recess.

As shown in FIG. 1A at stage 104a, substrate 100 includes base portion 106 and microfabricated structures 108 formed on base portion 106. Structures 108 define recesses 110. This disclosure contemplates structures 108 being patterned into any suitable features. For example, although this disclosure primarily describes "recesses," other suitable features might be formed in or on a semiconductor substrate, including (whether or not considered "recesses") lines, holes, trenches, vias, and/or other suitable structures, using embodiments of this disclosure. Structures 108 and recesses 110 may be formed using conventional lithography processes and/or other suitable deposition and etch processes. Base portion 106 and structures 108 may include the same or different materials (or combinations of materials), as appropriate.

Substrate 100 generically refers to a workpiece being processed in accordance with embodiments of this disclosure. Substrate 100 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 100 is not limited to any particular base structure, underlying layer or overlying layer, patterned or un-patterned, but rather, may include any such layer or base structure, and any combination of layers and/or base structures. Substrate 100 may be a bulk substrate such as a bulk silicon substrate, a silicon on insulator substrate, or various other semiconductor substrates.

Structures 108 have respective top surfaces 112, and recess 110 has bottom surface 113. In certain embodiments, structures 108 and recesses 110 differ in height relative to each other. For example, in certain embodiments, recesses have a height 114 (in a z-direction from a bottom of base portion 106 to bottom surface 113 of recess 110), and structures 108 have a second height 116 (from a bottom of base portion 106 to top surfaces 112 of structures 108 in the z-direction). In certain embodiments, the height difference of structures 108 and recess 110 relative to each other may be between 10 nm and 100 nm (e.g., greater than 50 nm). In other embodiments, the height difference may be greater than 5 microns, in case of a deep opening/trench for example. Structures 108 are separated by a gap (e.g., defined by recess 110), which may have any suitable width 118 for a given application.

Figure 1B:
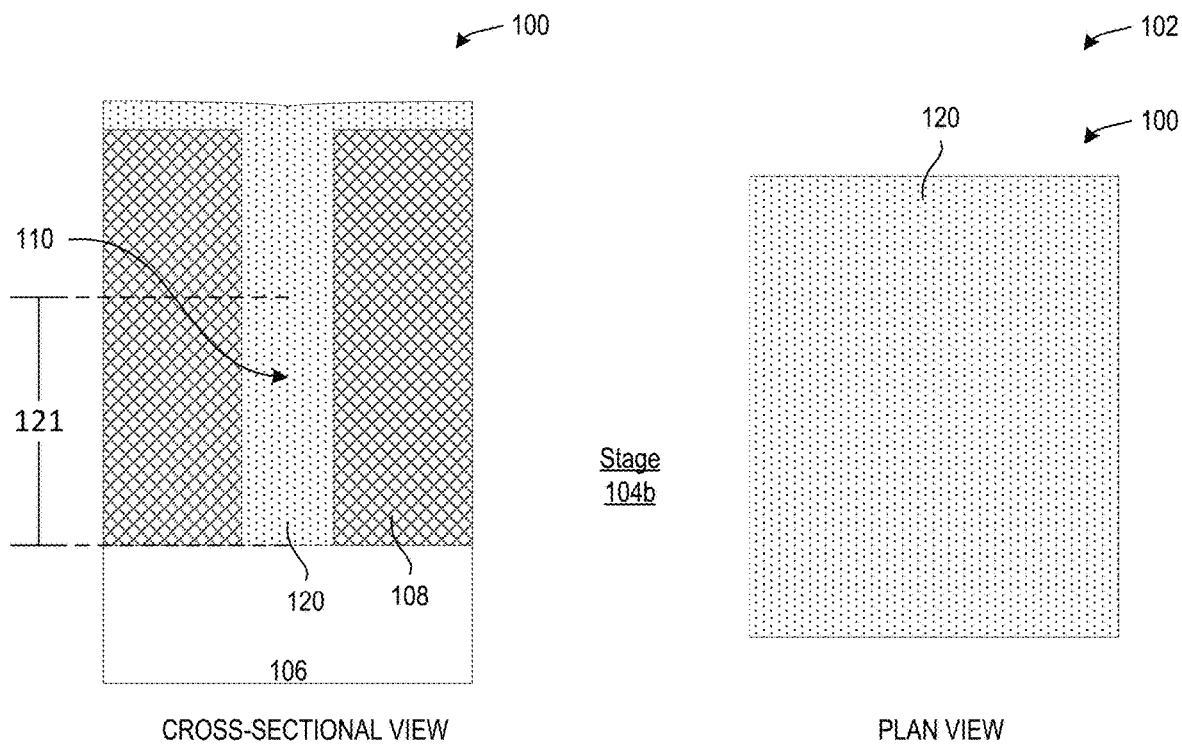

As shown in FIG. 1B at stage 104b, a fill material 120 has been deposited on substrate 100. Fill material 120 may be deposited in any suitable manner. For example, fill material 120 may be deposited using spin-on deposition (or spin-coating), spray-coating, roll-coating, chemical vapor deposition (CVD), or any other suitable deposition technique. Fill material 120 fills recess 110 and covers structures 108. In subsequent photolithography steps, it may be desirable to recess, via photolithographic development techniques, fill material 120 into recess 110, such that fill material 120 has a particular height within recess 110.

In certain embodiments, fill material 120 is a resin film, such as a polymer resin. Fill material 120 may have a photo-de-protectable property and, as deposited, may be resistant to being dissolved by a given solvent (which also may be referred to as a developer). As will be described in later stages, after exposure to a particular acid, however, the fill material 120 can experience a solubility change after which the fill material 120 (or portions thereof) is no longer protected from the solvent and will dissolve in the solvent. For example, in certain embodiments, fill material 120 is an acid de-protectable polymer, and a portion of the polymer will react with a certain species (e.g., an acid) to decompose in order to shift solubility of fill material 120 such that fill material 120 will dissolve or otherwise wash away if de-protected in a particular way. As particular examples, fill material 120 may be a copolymer or terpolymer composed of multiple types of monomers with at least one of the monomers able to decompose in the presence of a strong acid to make a more polar group like a carboxylic acid terminal group, so that fill material 120 will be more soluble in an aqueous medium. As a particular example, fill material 120 may include multiple monomer types including an acid sensitive monomer such as tert-butyl acrylate or methyl adamantyl methacrylate.

In certain embodiments, fill material 120 includes a photosensitive material such as a positive, negative, or a hybrid toned photoresist. In one example, fill material 120 includes phenol formaldehyde resin or a diazo-naphthoquinone based resin. In certain embodiments, fill material 120 may include a chemically amplified resist. In other embodiments, fill material 120 may include a non-chemically amplified resist material, such as PolyMethyl MethAcrylate (PMMA) or Hydrogene SilsesQuioxance (HSQ).

It may be desirable to remove a portion of fill material 120, including within recess 110, such that fill material has a predetermined target height 121 within recess 110. In this example, target height 121 is shown to be measured from bottom surface 113 of recess 110; however, the target height of fill material 120 within recess 110 may be measured from any suitable location, such as the bottom of base portion 106.

Target height 121 also may be considered a target thickness of fill material 120. Fill material 120 is initially resistant to development by one or more solvents that will be used in a subsequent process to remove portions of fill material 120.

Figure 1C:
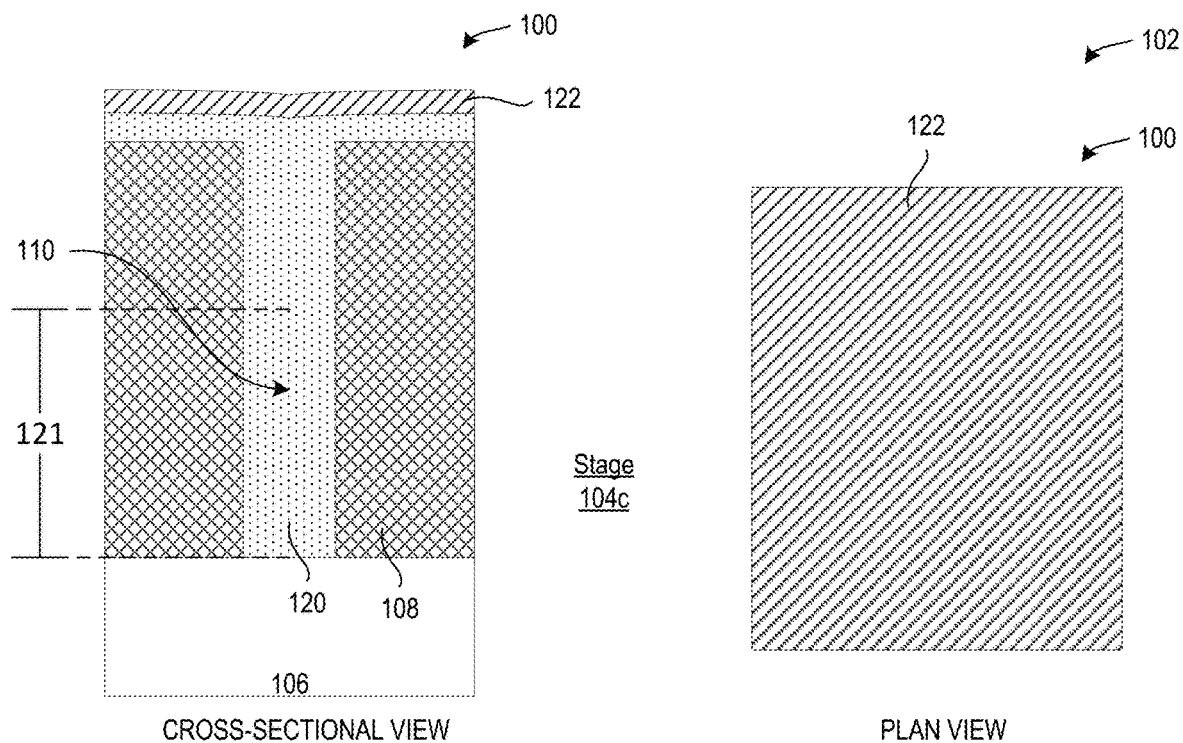

As shown in FIG. 1C at stage 104c, an overcoat film 122 has been deposited on substrate 100. Overcoat film 122 may be deposited in any suitable manner, including spin-on deposition (or spin-coating), spray-coating, roll-coating, CVD, or any other suitable deposition technique. Overcoat film 122 contains a photo-activated agent generator that generates, in response to actinic radiation, a solubility-changing agent for changing the solubility of another material (e.g., the material of overcoat film 122 and/or fill material 120) to be soluble in one or more solvents to be used in a subsequent removal process. In certain embodiments, the photo-activated agent generator is a PAG and the solubility-changing agent is acid.

Aside the photo-activated agent generator, overcoat film 122 might or might not include the same material as or a similar material to fill material 120. In certain embodiments, in addition to the photo-activated agent generator, overcoat film 122 may include a polymer resin that has a solubility in a solvent (to be used subsequently to remove a de-protected portion of fill material 120 in recess 110) that is similar to the solubility of the de-protected fill material 120 in the solvent, so that the de-protected portion of fill material 120 and overcoat film 122 can be removed in one step. In certain embodiments, the photo-activated agent generator of overcoat film 122 is pre-formulated in the material (e.g., the resin) of overcoat film 122.

Figure 1D:
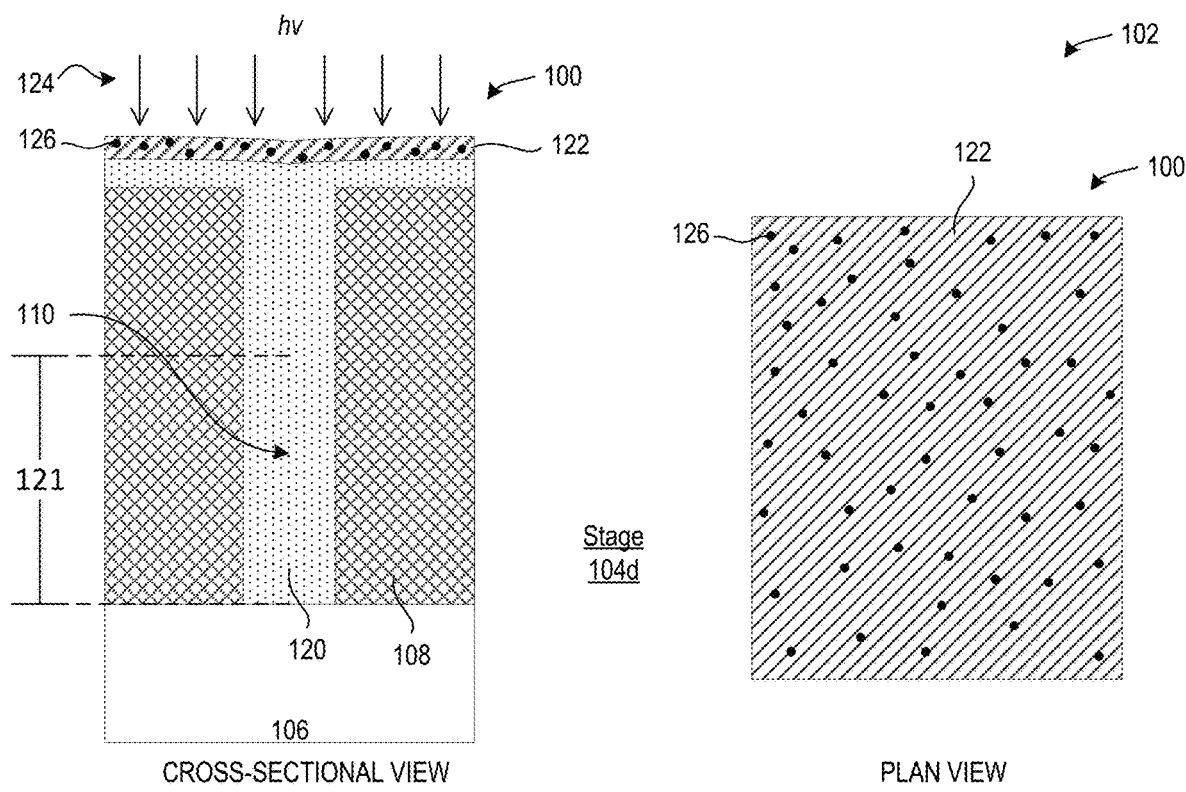

As shown in FIG. 1D at stage 104d, overcoat film 122 is exposed to actinic radiation 124 for a suitable time period. In particular, overcoat film 122 is exposed to sufficient actinic radiation 124 to cause the photo-activated agent generator (e.g., the PAG) in overcoat film 122 to generate a solubility-changing agent 126 (e.g., acid) within overcoat film 122 such that overcoat film 122 now includes solubility-changing agent 126. Solubility-changing agent 126 causes overcoat film 122 to become solubilized, such that overcoat film 122 is now soluble in one or more solvents to be used in a subsequent removal process.

Actinic radiation 124 may include light at a suitable wavelength and having other suitable characteristics to activate the photo-activated agent generator (e.g., the PAG) in overcoat film 122, causing the photo-activated agent generator in overcoat film 122 to generate solubility-changing agent 126 (e.g., acid) within overcoat film 122. Characteristics of actinic radiation 124 that may affect whether the photo-activated agent generator in overcoat film 122 is activated to generate solubility-changing agent 126 within overcoat film 122 (and in what quantities) include content of overcoat film 122, the type of photo-activated agent generator, the wavelength of actinic radiation 124, the time period for which overcoat film 122 is exposed to actinic radiation 124, and other suitable factors.

A predetermined photo-activated agent generator (e.g., PAG) may be sensitive to either a predetermined wavelength or to a predetermined range of wavelengths, permitting the use of various exposure sources. As just one example, the wavelength of actinic radiation 124 may be in a range of about 170 nm to about 405 nm, and exposure time may be about 10 seconds to about a minute (for a wafer of which the portion shown in FIGS. 1A-1J is a part). The polymer of fill material overcoat film 122 can be transparent or near-transparent to the predetermined wavelength.

It should be understood, however, that the values and actinic radiation sources are provided as examples only. In certain embodiments, as described below with reference to FIGS. 4B and 4F, substrate 100 is part of a larger substrate, and actinic radiation 124 is part of a larger pattern of actinic radiation that is directed to an overcoat film (of which overcoat film 122 is a part) on the larger substrate. Exposure to actinic radiation (e.g., light) can be executed with a scanner using a mask-based exposure, or via a direct-write exposure step, or a flood exposure, as just a few examples. A physical lithographic exposure stepper or scanner can be used as well. In another example, a comparably simple scanning laser system could be used that can vary the exposure energy spatially across a surface of a wafer. The particular wavelength of and exposure time to actinic radiation 124 suitable for a given implementation may be affected by the tool used, including the intensity of the laser.

Figure 1E:
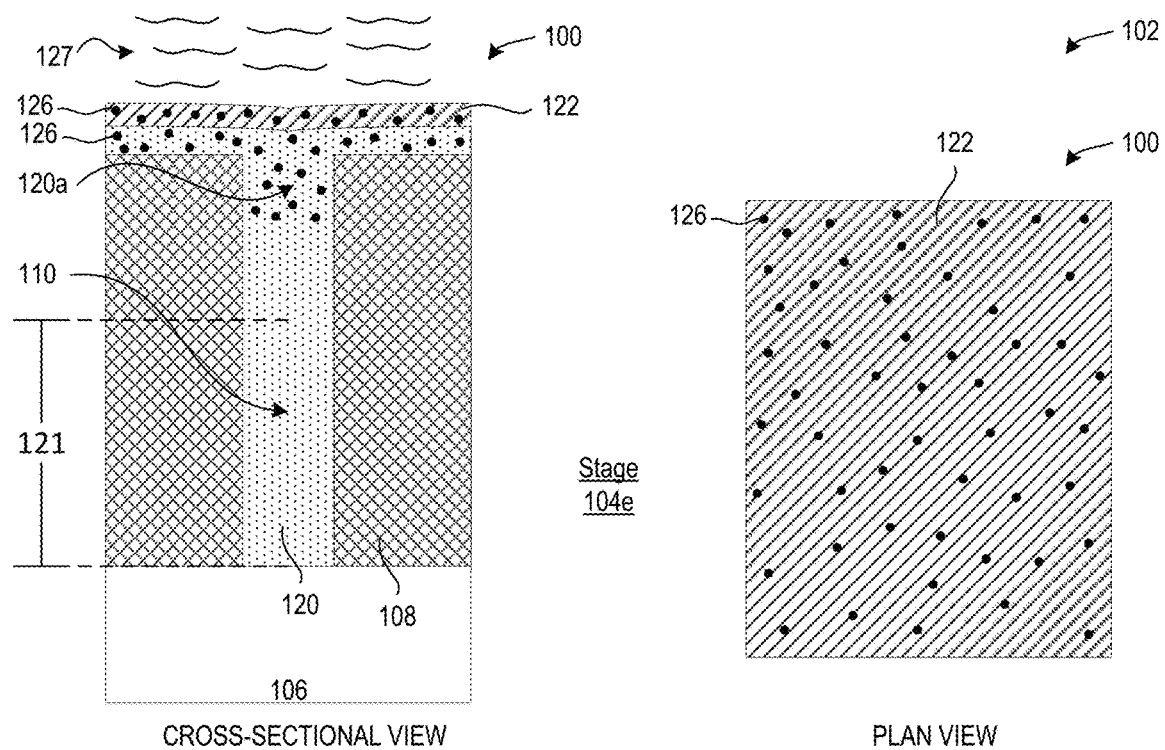
Figure 1F:
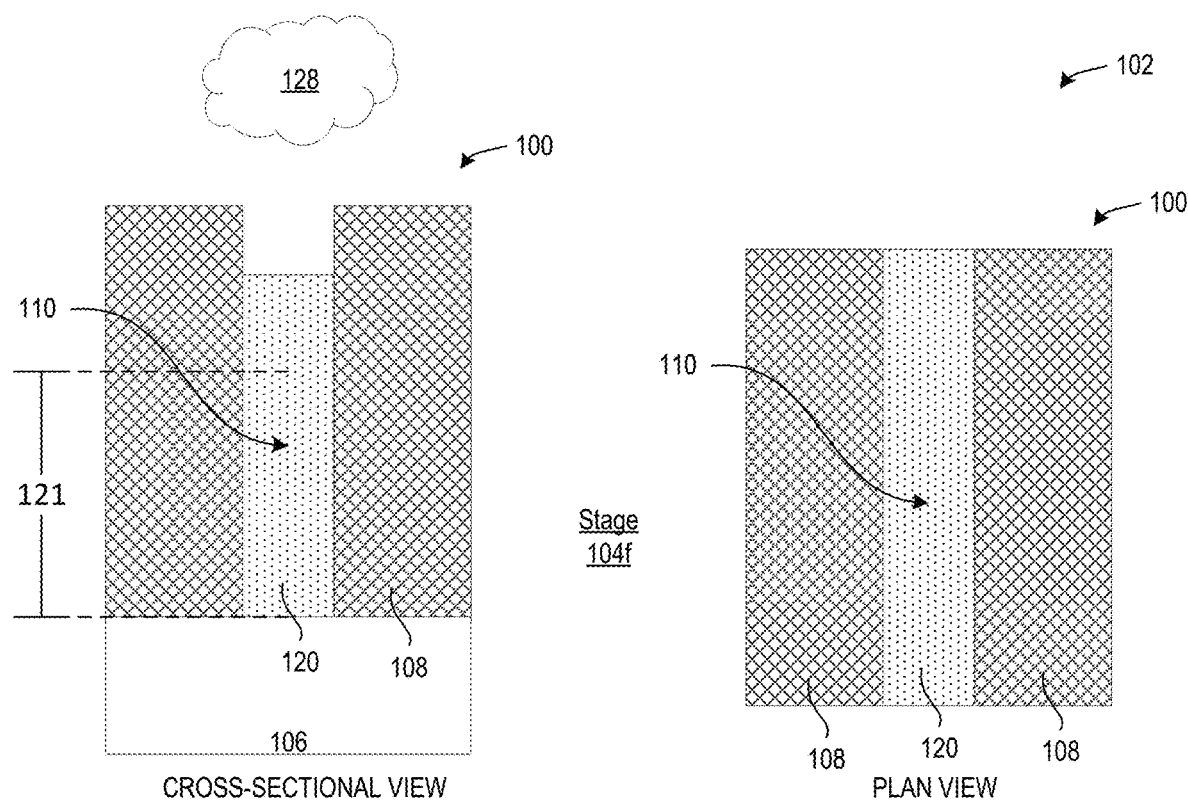

As shown in FIG. 1E at stage 104e, to modify at least a portion of fill material 120 to be soluble in a solvent to be used in a later removal process, solubility-changing agent 126 has diffused into fill material 120, causing a portion (de-protected portion 120a) of fill material 120 to become soluble to the solvent to be used in a later removal process. De-protected portion 120a is generally shown as the portion of fill material 120 into which solubility-changing agent 126 has diffused. Diffusion of solubility-changing agent 126 into fill material 120 results in solubility-changing reactions within fill material 120 to the depth at which solubility-changing agent 126 (e.g., to the predetermined depth) diffuses into fill material 120, resulting in de-protected portion 120a. De-protected portion 120a of fill material 120 then becomes soluble to one or more particular solvents, which also may be referred to as developers. The de-protection reaction resulting from the diffusion of solubility changing agent 126 into a portion of fill material 120 (creating de-protected portion 120a) could be a de-crosslinking reaction within the portion of fill material 120. A similar reaction may occur within overcoat film 122 to cause overcoat film 122 to become solubilized.

Solubility-changing agent 126 may be diffused into fill material 120 using any suitable process. In certain embodiments, a thermal process (e.g., heat 127) is used to diffuse solubility-changing agent 126 into at least a portion of fill material 120. For example, to apply heat 12, substrate 100 may be baked, and the heat associated with baking substrate 100 causes solubility-changing agent 126 to diffuse into at least a portion of fill material 120. Substrate 100 may be baked via a substrate plate in a suitable tool, via ambient heat in a substrate processing chamber of a suitable tool, a combination of these, or in any other suitable manner.

In certain embodiments, solubility-changing agent 126 is diffused a predetermined depth into fill material 120 to modify the solubility of fill material 120 to the predetermined depth. The predetermined depth might or might not be sufficient to reach target height 121 for fill material 120 in recess 110. In the illustrated example, the predetermined depth of stage 104e is insufficient to recess fill material 120 to target height 121 of fill material 120 in recess 110.

The depth to which solubility-changing agent 126 is diffused into fill material 120 may be affected by and/or controlled using a variety of factors, including the content of overcoat film 122 (including the type of the photo-activated agent generator in overcoat film 122, other ingredients of overcoat film 122, and concentration of the photo-activated agent generator in overcoat film 122), characteristics of actinic radiation 124 (e.g., used at stage 104d, or later stages), content of fill material 120, width 118 in relation to a difference between height 116 and 114 (which may be referred to as the aspect ratio of recess 110 and may affect the ability of actinic radiation 124 to activate the photo-activated agent generator to generate solubility-changing agent 126, particularly as fill material 120 has been recessed into recess 110 at later stages), exposure dose of actinic radiation 124, heating (e.g., bake) time and temperature, and any of a variety of other factors.

As shown in FIGURE F at stage 104f, overcoat film 122 and de-protected portion 120a of fill material 120 have been removed. In certain embodiments, overcoat film 122 and de-protected portion 120a of fill material 120 are developed using a solvent 128, causing overcoat film 122 and de-protected portion 120a of fill material 120 to be removed from substrate 100.

This disclosure contemplates solvent 128 including any suitable substance for removing overcoat film 122 and de-protected portion 120a of fill material 120. As just one example, solvent 128 may include an aqueous solution of tetramethyl ammonium hydroxide that is capable of solubilizing an acid-deprotected resin (e.g., de-protected portion 120a of fill material 120). Solvent 128 also may be referred to as a developer.

Removal of overcoat film 122 and de-protected portion 120a of fill material 120 causes a change in height of fill material 120 in recess 110 commensurate with exposure dose (e.g., the depth of diffusion of solubility-changing agent 126 into fill material 120, or the depth of de-protected portion 120a of fill material 120).

This process of depositing overcoat film 122 (stage 104c), exposure to actinic radiation 124 (stage 104d), diffusion via baking for a time period (stage 104e), and development of a de-protected portion of fill material 120 (stage 104f) may be repeated until a cumulative depth of fill material 120 de-protection and development (removal) reaches target height 121 such that remaining fill material 120 in recess 110 is approximately at target height 121. For example, FIGS. 1G-1J illustrate a second iteration of this cyclic process, which in this example is sufficient to achieve target height 121 of fill material 120 in recess 110.

Figure 1G:
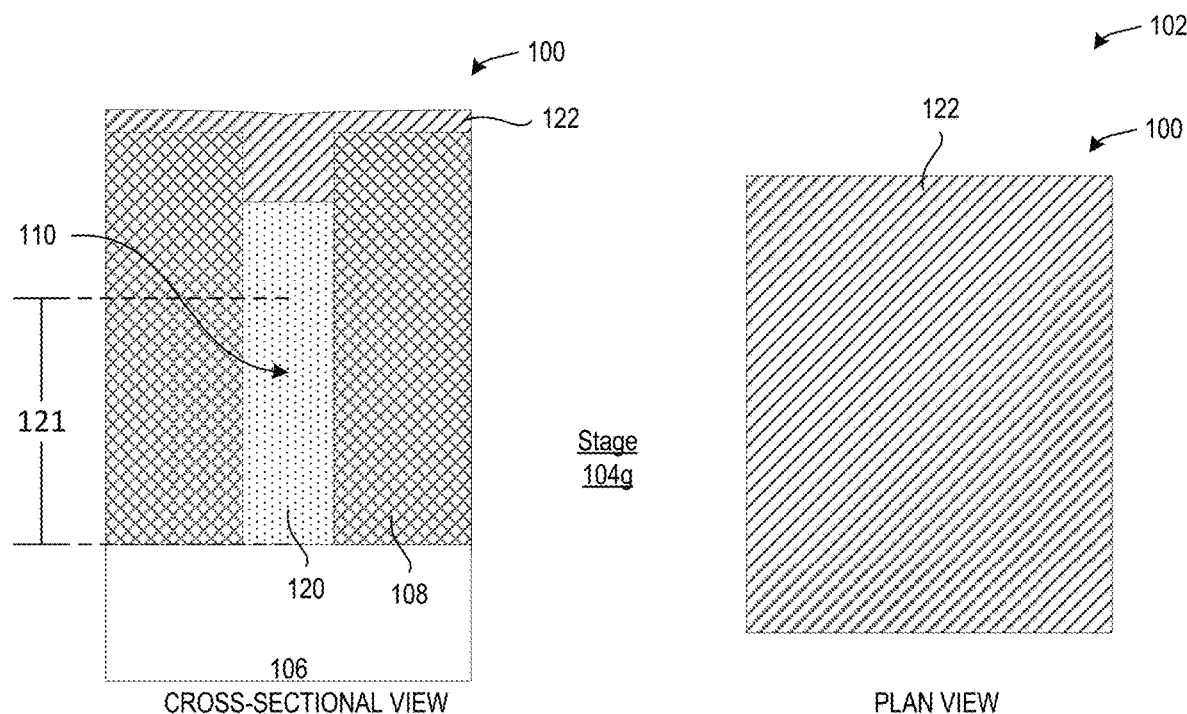

In particular, FIG. 1G illustrates stage 104g in which overcoat film 122 has again been deposited on substrate 100. Overcoat film 122 again contains a photo-activated agent generator (e.g., a PAG) that generates, in response to actinic radiation, a solubility-changing agent (e.g., acid) for changing the solubility of the material of overcoat film 122 and/or fill material 120 to be soluble in one or more solvents to be used in a subsequent removal process.

Figure 1H:
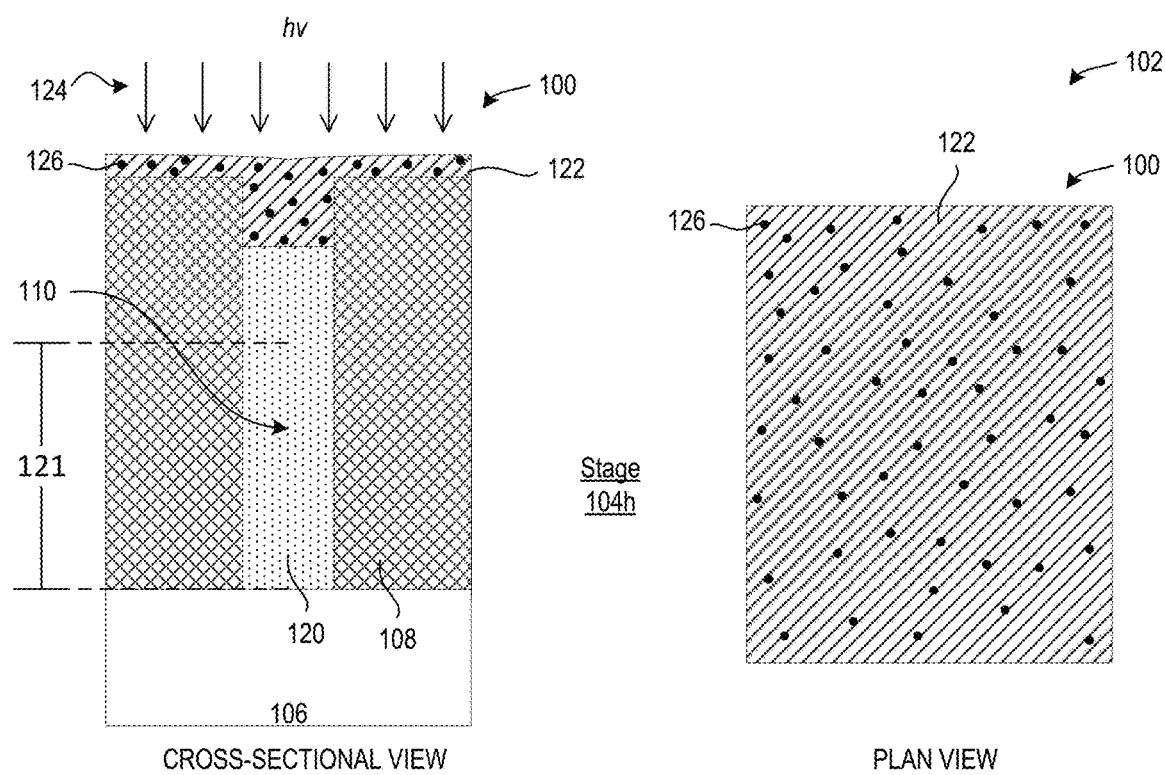

FIG. 1H illustrates stage 104h in which overcoat film 122 is exposed to actinic radiation 124, causing the photo-activated agent generator in overcoat film 122 to generate solubility-changing agent 126 within overcoat film 122 such that overcoat film 122 now includes solubility-changing agent 126 and causing overcoat film 122 to become solubilized (soluble in one or more solvents to be used in a subsequent removal process).

Figure 1I:
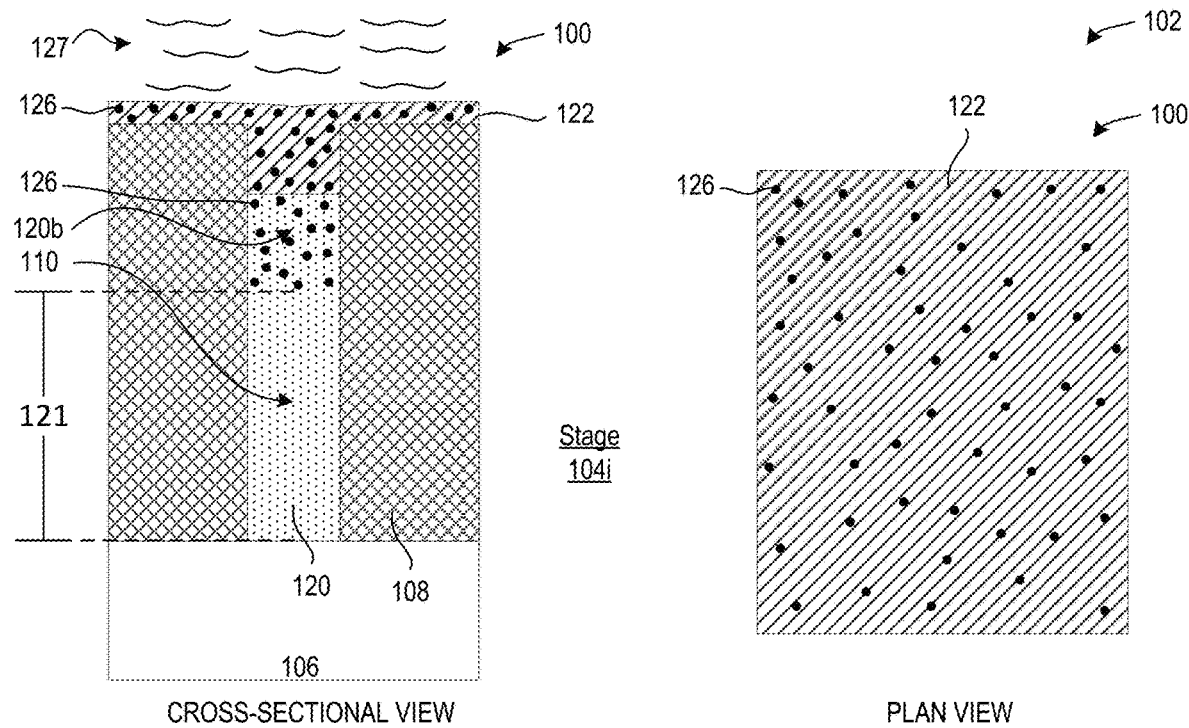

FIG. 1I illustrates stage 104i in which solubility-changing agent 126 has diffused into fill material 120, causing a further portion (de-protected portion 120b) of fill material 120 to become soluble to a solvent (e.g., solvent 128). De-protected portion 120b is generally shown as the portion of fill material 120 into which solubility-changing agent 126 has diffused. As described above, solubility-changing agent 126 may be diffused into fill material 120 using a thermal process (e.g., baking of substrate 100). In certain embodiments, solubility-changing agent 126 is diffused a predetermined depth into fill material 120 to modify the solubility of fill material 120 to the predetermined depth. In this example, the predetermined depth is sufficient to de-protect fill material 120 to target height 121.

Figure 1J:
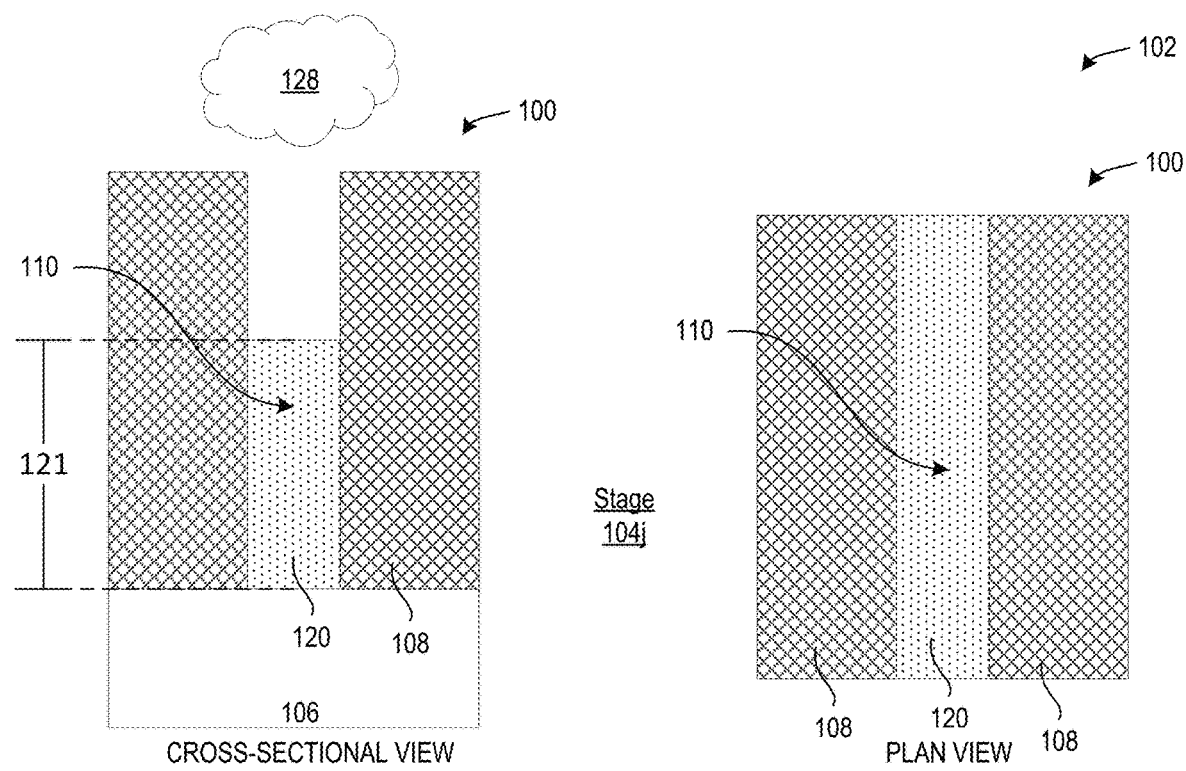

FIG. 1J illustrates stage 104j in which overcoat film 122 and de-protected portion 120b of fill material 120 have been removed. In certain embodiments, overcoat film 122 and de-protected portion 120a of fill material 120 are developed using solvent 128, causing overcoat film 122 and de-protected portion 120a of fill material 120 to be removed from substrate 100. In this example, removal of overcoat film 122 and de-protected portion 120b of fill material 120 causes a change in height of fill material 120 in recess 110 such that the remaining fill material 120 in recess 110 is substantially at target height 121.

Although in the illustrated example, two iterations of the cyclic process are sufficient to achieve target height 121 of fill material 120 in recess 110, this disclosure contemplates any suitable number of iterations being sufficient to reach target height 121 for a given application. For example, more than two iterations may be appropriate to remove sufficient fill material 120 to reach target height 121 of fill material in recess 110. In another example, a single iteration (e.g., of stages 104b-104f) may be adequate to remove sufficient fill material 120 to reach target height 121 of fill material in recess 110. Furthermore, the predetermined depth of diffusion of solubility-changing agent 126 into fill material 120 and subsequent removal of a de-protected portion of fill material 120 may be the same from one iteration to the next (and potentially across all iterations) or may vary from one iteration to the next (and potentially across all iterations), according to particular needs.

Subsequent processing may then be performed on semiconductor substrate 100. For example, process 102 may be integrated into a process for forming a semiconductor device using a variety of deposition and etch processes.

FIGS. 2A-2I illustrate cross-sectional and plan views of substrate 100 during an example process 202 for processing substrate 100, according to certain embodiments. In particular, process 202 includes one or more iterations of using a PAG-based process (e.g., process 102) for locational de-protection of portions of fill material 120 and one or more subsequent iterations of a TAG-based process for de-protection of portions of fill material 120.

FIGS. 2A-2F generally correspond to FIGS. 1A-1F, and details described above with respect to FIGS. 1A-1F that are not repeated are incorporated by reference. In general, FIGS. 2A-2F illustrate an iteration of receiving substrate 100 (stage 204a); depositing fill material 120 over substrate 100 (fill material 120 filling recess 110 and covering structures 108, fill material 120 being initially resistant to development by solvent 128) (stage 204b); depositing overcoat film 122 (containing a photo-activated agent generator (e.g., PAG) that generates, in response to actinic radiation 124, solubility-changing agent 126 (e.g., acid)) on substrate 100 (stage 204c); exposing overcoat film 122 to actinic radiation 124 to generate solubility-changing agent 126 within overcoat film 122 (stage 204d); diffusing (e.g., by exposing substrate 100 to heat) solubility-changing agent 126 a predetermined depth into fill material 120, causing a portion (e.g., de-protected portion 120a) of fill material 120 to become soluble to solvent 128) (stage 204e); and developing overcoat film 122 and de-protected portion 120a of fill material 120 using solvent 128, causing overcoat film 122 and de-protected portion 120a of fill material 120 to be removed from substrate 100 (stage 204f). That is, FIGS. 2A-2F illustrate an iteration of a PAG-based process for removing a portion of fill material 120 in recess 110.

Figure 2A:
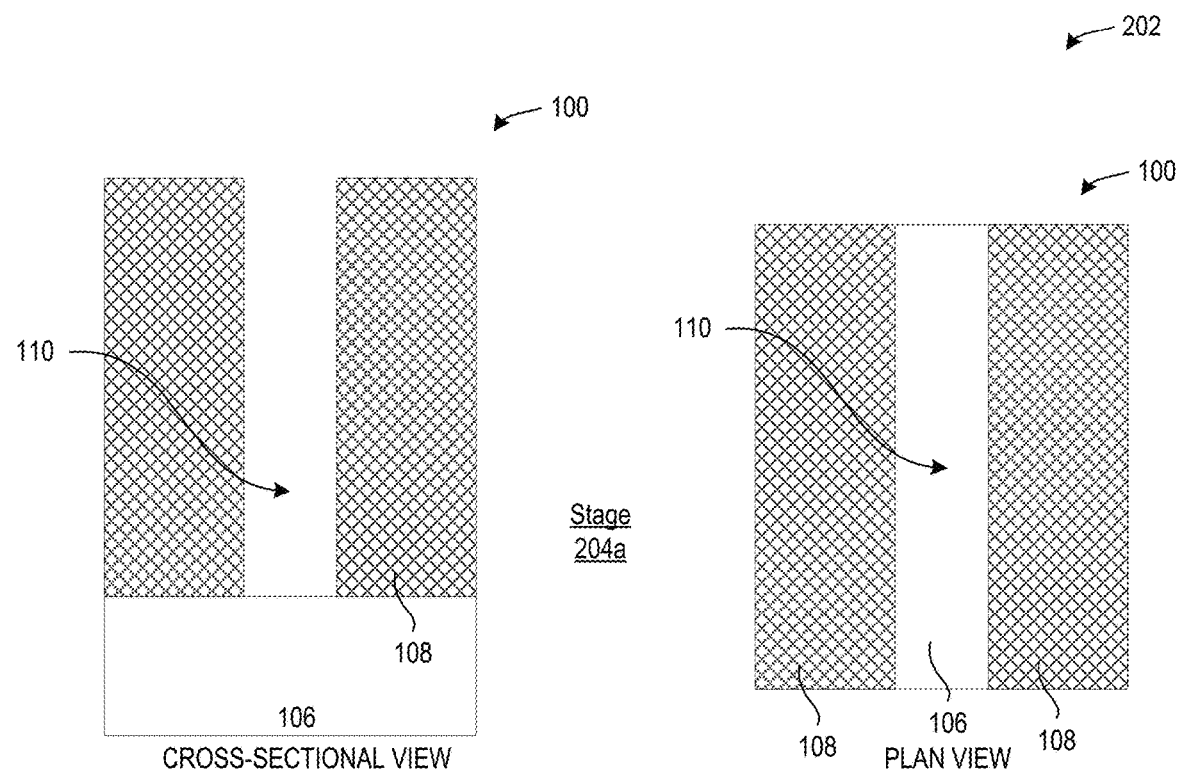
FIGS. 2A-2I illustrate cross-sectional and plan views of an example substrate during an example process for processing the substrate.
Figure 2B:
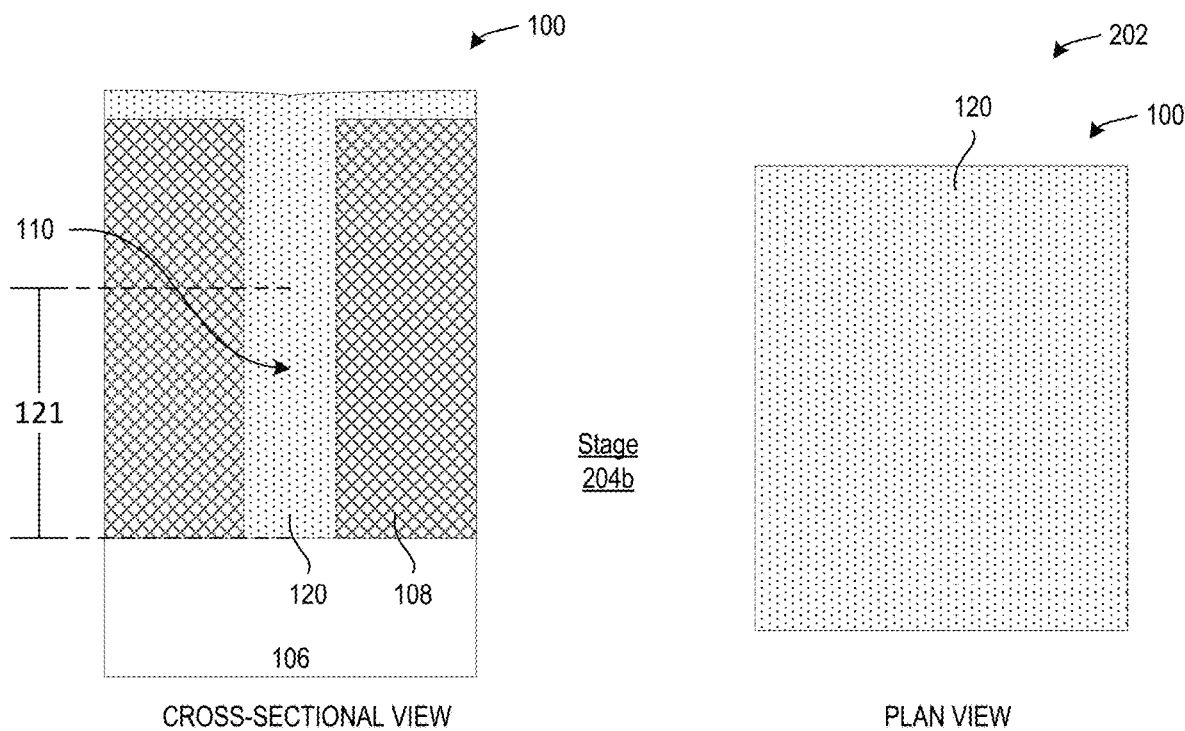
Figure 2C:
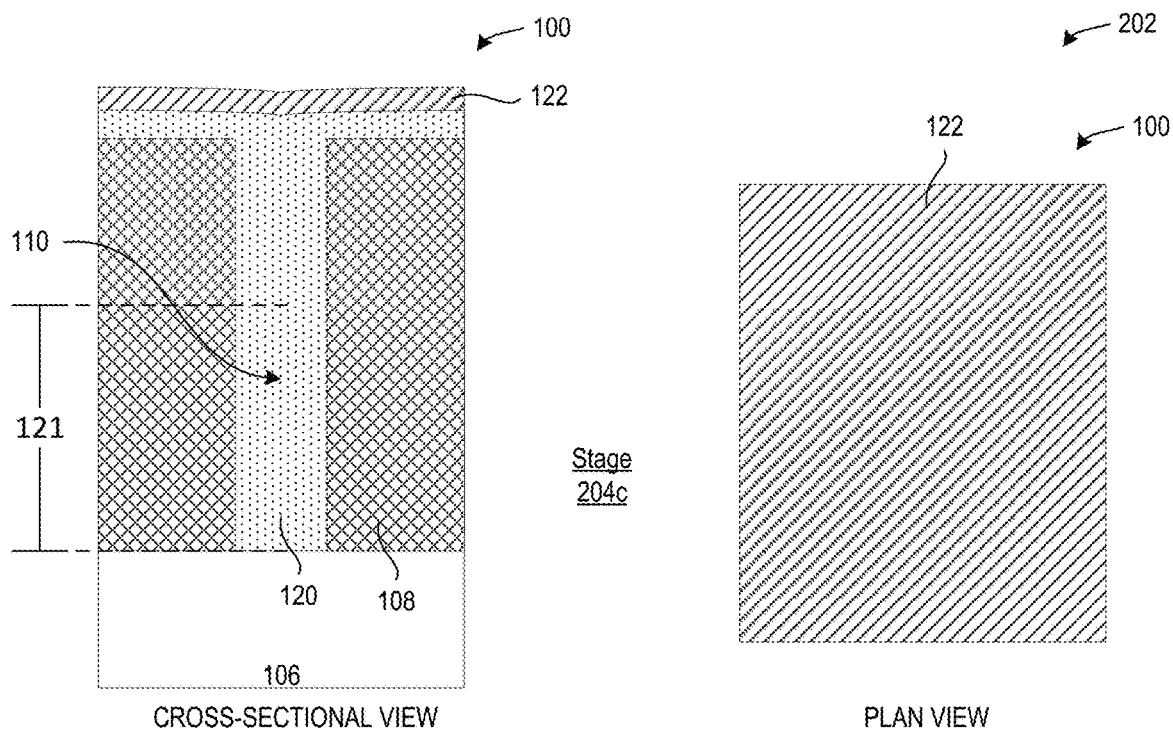
Figure 2D:
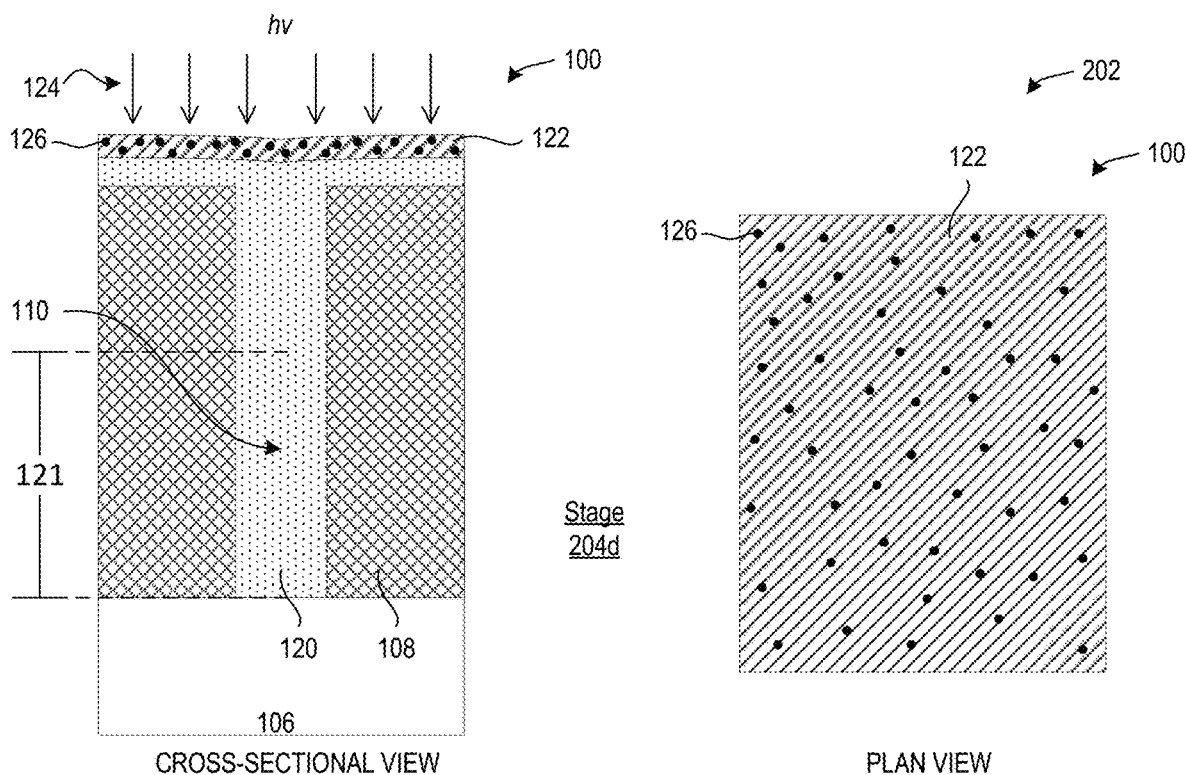
Figure 2E:
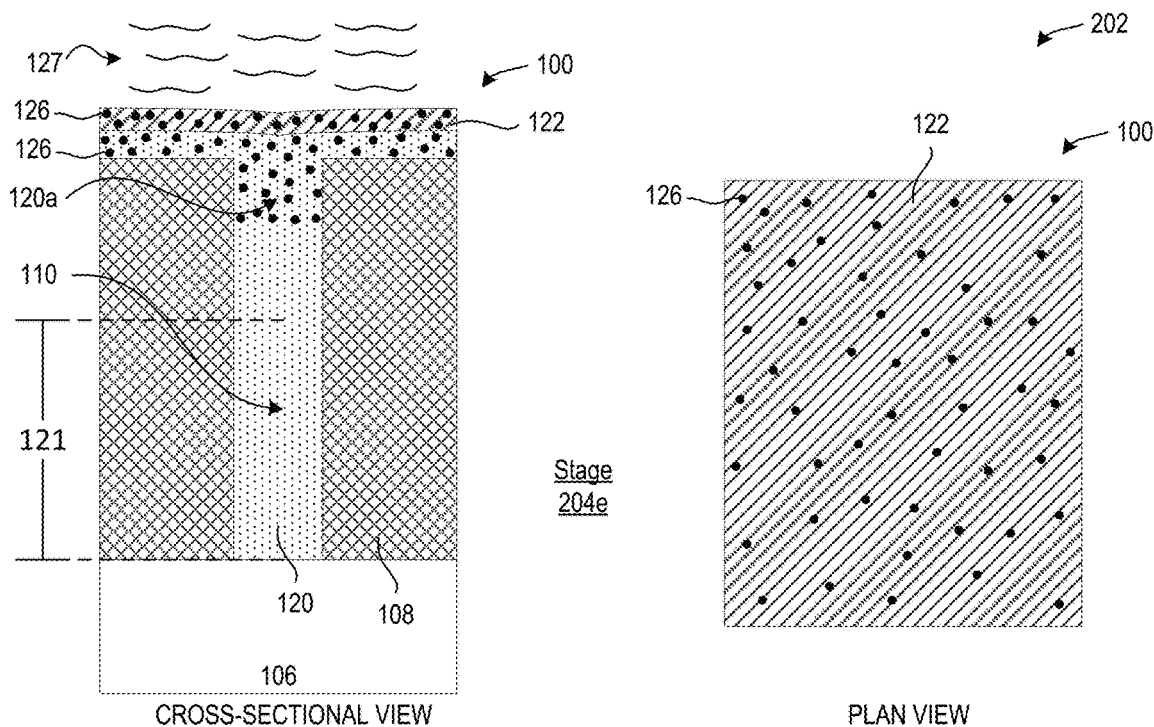
Figure 2F:
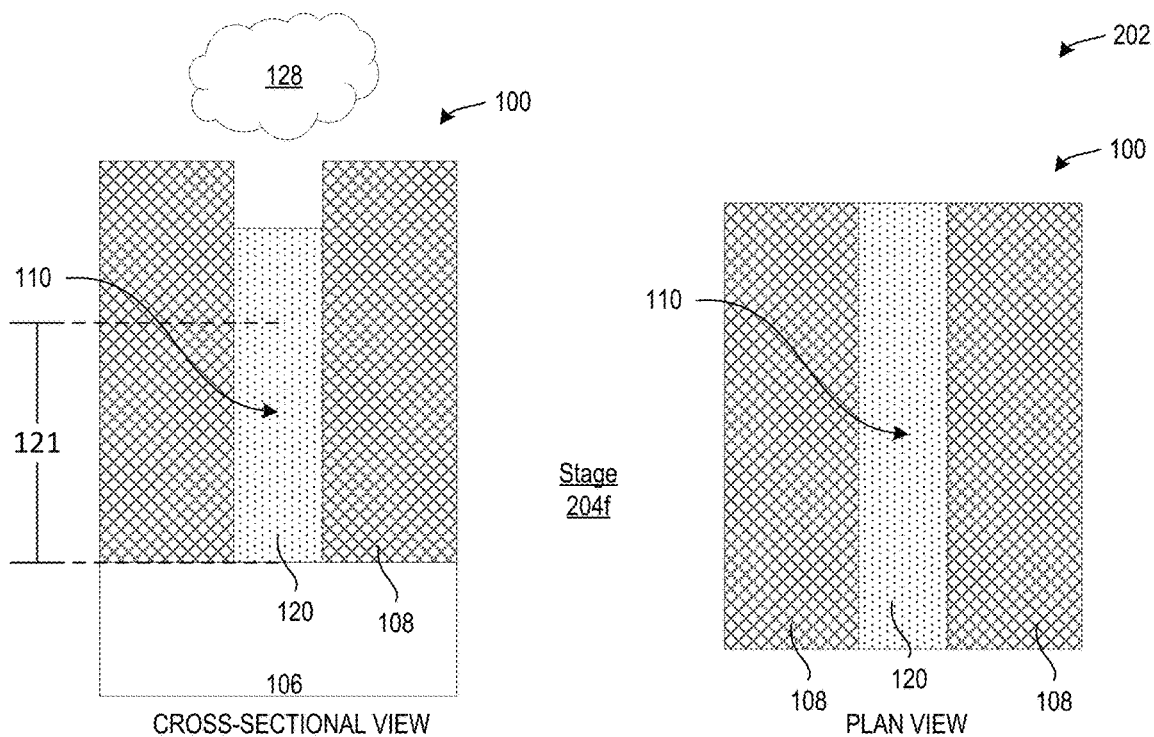
Figure 2G:
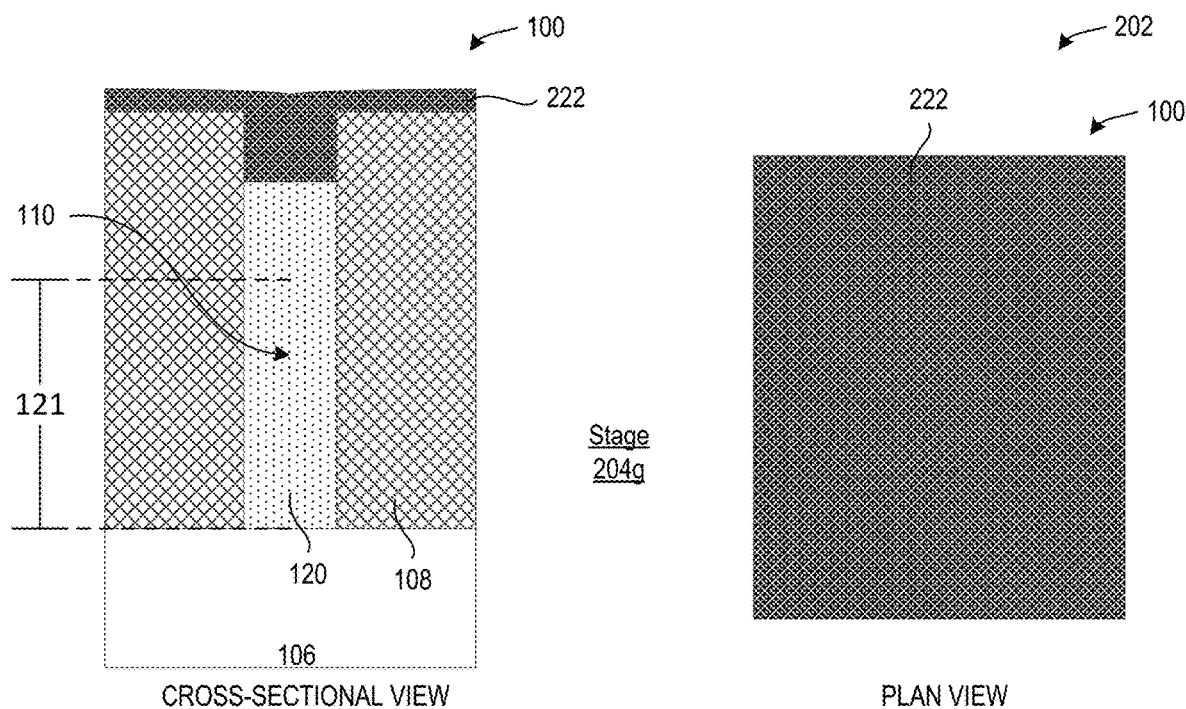
Figure 2H:
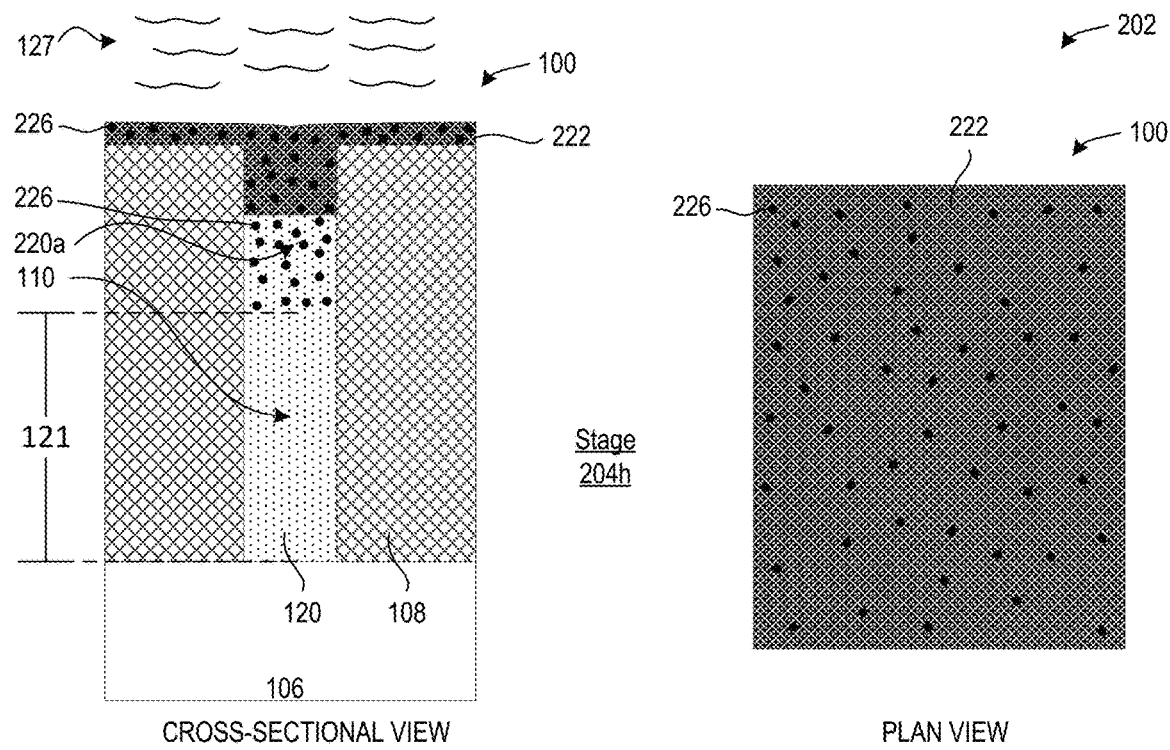
Figure 2I:
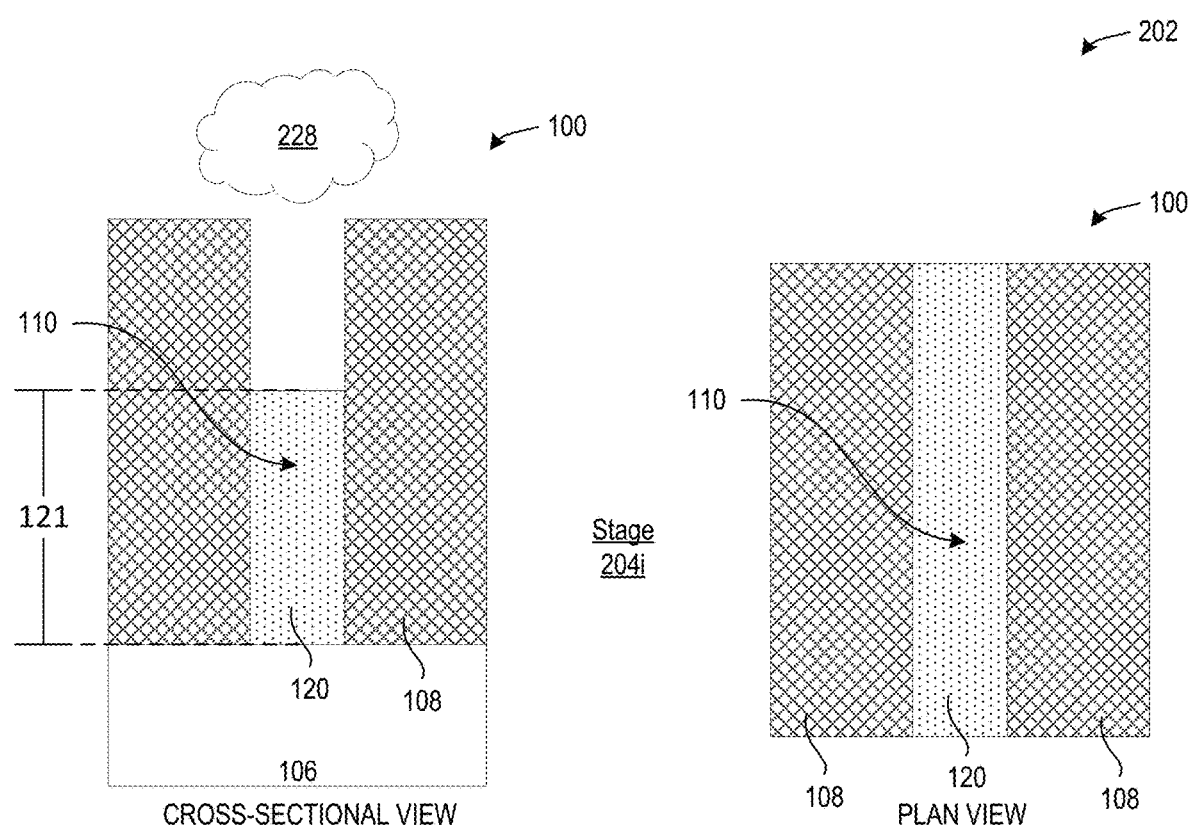

FIGS. 2G-2I illustrate a TAG-based process, which may be performed one or more times, for removing additional portions of fill material 120 in recess 110 until target height 121 is reached. As shown in FIG. 2G at stage 204g, an overcoat film 222 has been deposited on substrate 100. Overcoat film 222 may be deposited in any suitable manner, including spin-on deposition (or spin-coating), spray-coating, roll-coating, CVD, or any other suitable deposition technique. Overcoat film 222 contains a thermally-activated agent generator that generates, in response to heat, a solubility-changing agent for changing the solubility of another material (e.g., the material of overcoat film 222 and/or fill material 120) to be soluble in one or more solvents to be used in a subsequent removal process. In certain embodiments, the thermally-activated agent generator is a TAG and the solubility-changing agent is acid.

Aside from the thermally-activated agent generator, overcoat film 222 might or might not include the same material as or similar material to fill material 120. In certain embodiments, in addition to the thermally-activated agent generator, overcoat film 222 may include a polymer resin that has a solubility in a solvent (to be used subsequently to remove a de-protected portion of fill material 120) that is similar to the solubility in the solvent of the de-protected fill material 120, so that the de-protected portion of fill material 120 and overcoat film 222 can be removed in one step. In certain embodiments, the thermally-activated agent generator of overcoat film 222 is pre-formulated in the resin of overcoat film 222.

As shown in FIG. 2H at stage 204h, overcoat film 222 is exposed to heat 127 for a suitable time period. In particular, overcoat film 222 is exposed to sufficient heat 12 to cause the thermally-activated agent generator (e.g., the TAG) in overcoat film 222 to generate a solubility-changing agent 226 (e.g., acid) within overcoat film 222 such that overcoat film 222 now includes solubility-changing agent 226. Solubility-changing agent 226 causes overcoat film 222 to become solubilized, such that overcoat film 222 is now soluble in one or more solvents to be used in a subsequent removal process. In certain embodiments, a thermal process (e.g., heat 127) is used to activate the thermally-activated agent generator within overcoat film 222. For example, to apply heat 12, substrate 100 may be baked, and the heat associated with baking substrate 100 causes the thermally-activated agent generator to generate solubility-changing agent 226 within overcoat film 222. Substrate 100 may be baked via a substrate plate in a suitable tool, via ambient heat in a substrate processing chamber of a suitable tool, a combination of these or in any other suitable manner.

Continuing with stage 204h in FIG. 2H, in addition to causing the thermally-activated agent generator in overcoat film 222 to generate solubility-changing agent 226 within overcoat film 222, the thermal process applied to (e.g., heating of) substrate 100 also causes solubility-changing agent 226 to diffuse a predetermined depth into fill material 120. Diffusion of solubility-changing agent 226 into fill material 120 modifies at least a portion (de-protected portion 220a) of fill material 120 to be soluble in a solvent to be used in a later removal process. De-protected portion 220a is generally shown as the portion of fill material 120 into which solubility-changing agent 226 has diffused. Diffusion of solubility-changing agent 226 into fill material 120 results in solubility-changing reactions within fill material 120 to the depth at which solubility-changing agent 226 (e.g., to the predetermined depth) diffuses into fill material 120, resulting in de-protected portion 220a. De-protected portion 220a of fill material 120 then becomes soluble to one or more particular solvents, which also may be referred to as developers. The de-protection reaction resulting from the diffusion of solubility changing agent 226 into a portion of fill material 120 (creating de-protected portion 220a) could be a de-crosslinking reaction within the portion of fill material 120. A similar reaction may occur within overcoat film 222 to cause overcoat film 222 to become solubilized.

In certain embodiments, solubility-changing agent 226 is diffused a predetermined depth into fill material 120 to modify the solubility of fill material 120 to the predetermined depth. The predetermined depth might or might not be sufficient to reach target height 121 for fill material 120 in recess 110. In the illustrated example, the predetermined depth of stage 204h is sufficient to recess fill material 120 to target height 121 of fill material 120 in recess 110. In embodiments in which the predetermined depth of stage 204h is insufficient to recess film material 120 to target height 121 of fill material 120 in recess 110, one or more additional iterations of stages 204g-204i may be performed.

The depth to which solubility-changing agent 226 is diffused into fill material 120 may be affected by and/or controlled using a variety of factors, including the content of overcoat film 222 (including the type of the thermally-activated agent generator in overcoat film 222, other ingredients of overcoat film 222, and concentration of the thermally-activated agent generator in overcoat film 222), the temperature of heat 127, the length of time for which substrate 100 is exposed to heat 127 (e.g., the time period of the bake), content of fill material 120, and any of a variety of other factors.

In certain embodiments, as described below with reference to FIG. 5A-5C, substrate 100 is part of a larger substrate, and heat 127 is applied across multiple (and potentially all) portions of the larger substrate. Exposure to heat 12 may cause a substantially uniform amount of solubility-changing agent 226 to be generated within overcoat film 222. Furthermore, exposure to heat 127 may cause a substantially uniform depth of diffusion of solubility-changing agent 226 into fill material 120.

As shown in FIG. 2I at stage 204i, overcoat film 222 and de-protected portion 220a of fill material 120 have been removed. In certain embodiments, overcoat film 222 and de-protected portion 220a of fill material 120 are developed using a solvent 228, causing overcoat film 222 and de-protected portion 220a of fill material 120 to be removed from substrate 100.

This disclosure contemplates solvent 228 including any suitable substance for removing overcoat film 222 and de-protected portion 220a of fill material 120. As just one example, solvent 228 may include an aqueous solution of tetramethyl ammonium hydroxide that is capable of solubilizing an acid-deprotected resin (e.g., de-protected portion 220a of fill material 120). In certain embodiments, if a resin (e.g., fill material 120) is designed to interact with a solubility changing agent other than an acid generator, then it may be possible to use an organic solvent as solvent 228. Solvent 228 might or might not be the same as solvent 128. Solvent 228 also may be referred to as a developer.

Removal of overcoat film 222 and de-protected portion 220a of fill material 120 causes a change in height of fill material 120 in recess 110 commensurate with exposure dose (e.g., the depth of diffusion of solubility-changing agent 226 into fill material 120, or the depth of de-protected portion 220a of fill material 120). In this example, removal of overcoat film 122 and de-protected portion 120b causes a change in height of fill material 120 in recess 110 such that the remaining fill material 120 in recess 110 is substantially at target height 121.

This process of depositing overcoat film 222 (stage 204g), heating substrate 100 (stage 204h), and subsequent development of de-protected portion 120a of fill material 120 (stage 204i) is repeated until a cumulative depth of fill material 120 de-protection and development reaches target height 121. For example, FIGS. 2G-2I illustrate a first iteration of this cyclic TAG-based process, which in this example is sufficient to achieve target height 121 of fill material 120 in recess 110. In other examples, additional iterations TAG-based may be used to remove sufficient fill material 120 to reach target height 121 of fill material in recess 110.

Although in the illustrated example of FIGS. 2A-2I a single iteration of using the photo-activated solubility-changing agent-generating ingredient (the PAG-based process) is illustrated and described, this disclosure contemplates process 202 including multiple iterations of using the photo-activated solubility-changing agent-generating ingredient prior to one or more iterations using the thermally-activated agent generator (the TAG-based process) to achieve target height 121 of fill material 120 in recess 110, according to particular needs. Furthermore, whether considering the PAG-based process or the TAG-based process, the predetermined depth of diffusion of solubility-changing agent 126/226 into fill material 120 and subsequent removal of a de-protected portion of fill material 120 may be the same from one iteration to the next (and potentially across all iterations) or may vary from one iteration to the next (and potentially across all iterations), according to particular needs.

Subsequent processing may then be performed on semiconductor substrate 100. For example, process 202 may be integrated into a process for forming a semiconductor device using a variety of deposition and etch processes.

Figure 3:
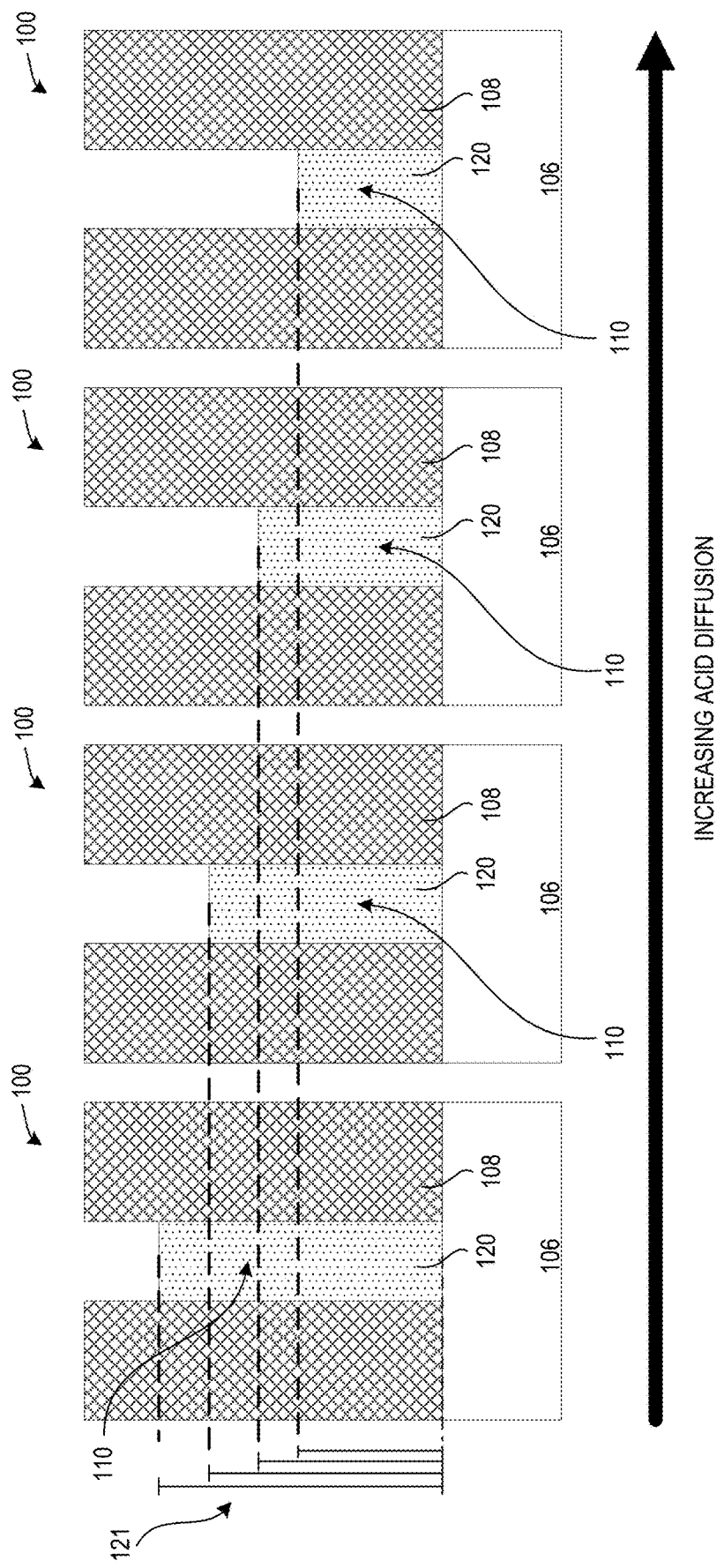
FIG. 3 illustrates example effects of varying depths of diffusion of a solubility-changing agent into a fill material.

FIG. 3 illustrates example effects of varying depths of diffusion of a solubility-changing agent 126/226 into fill material 120, according to certain embodiments. In general, FIG. 3 illustrates that, according to certain embodiments, as the depth of diffusions of solubility-changing agent 126/226 (e.g., acid) into fill material 120 increases, an increasing amount of fill material 120 is removed during a subsequent development process, which decreases the height of post-development fill material 120 in recess 110. Portions of fill material 120 into which solubility-changing agent 126/226 (e.g., acid) diffused become soluble to solvent 128/228, which allows solvent 128/228 to remove those portions of fill material 120 when fill material 120 is developed using solvent 128/228. The example embodiments control film height by location through acid diffusion into an acid solubility-changeable resin layer in which a greater degree of acid diffusion results in a larger change in film thickness per overcoat cycle. Thus, by controlling the depth of diffusion of solubility-changing agent 126/226 into fill material 120, the amount of fill material 120 removed (e.g., de-protected portion 120a/120b/220a) in a subsequent removal process can be controlled. Factors potentially affecting the depth of diffusions are described above.

FIGS. 4A-4H illustrate cross-sectional views of example substrate portions 400a-400d having pre-patterned features during example process 102 (described above with reference to FIGS. 1A-1J) for processing substrate portions 400a-400d, according to certain embodiments. For ease of reference, substrate portions 400a-400d may be referred to collectively as substrate 400. Substrate portions 400a-400d may be part of a same substrate 400, or may be part of different substrates 400. Substrate 400 may be part of a larger semiconductor device, such as part of a larger semiconductor wafer. Furthermore, substrate portions 400a-400d may be part of a same semiconductor wafer or one or more different semiconductor wafers. In certain embodiments, process 102 includes repeatedly performing a PAG-based process to remove a fill material from a recess 110 of substrate 400 until the fill material is a predetermined height within the recess 110. To the extent not repeated, details related to substrate 100 and process 102 described with reference to FIGS. 1A-1J (or elsewhere) are incorporated by reference.

As shown in FIG. 4A, in addition to base portion 106, substrate 400 includes multiple structures 108 that define multiple recesses 110. Although structures 108 are shown as generally having the same shapes, heights, and pitches, structures 108 may have any suitable shapes, heights, and/or pitches, including varying shapes, heights, and/or pitches. Additionally, although recesses 110 are shown as generally having the same shapes and depths, recesses 110 may have any suitable shapes and/or depths, including varying shapes and/or depths. This disclosure contemplates the structures 108 being patterned into any suitable features.

As shown in FIG. 4A (corresponding to stage 104c), fill material 120 has been deposited on substrate 400, with fill material 120 filling recesses 110 and covering structures 108, and overcoat film 122 has been deposited on substrate 400. In subsequent photolithography steps, it may be desirable to recess, via photolithographic development techniques, fill material 120 into recesses 110, such that fill material 120 has a particular height within recesses 110. A target height 121 for recessing fill material 120 within recesses 110 is indicated for each recess 110. In this example, a different target height 121 is desired for each recess 110, with little or no recessing of fill material 120 being desired for the right-most recess 110 in FIG. 4A. This disclosure contemplates a same target height 121 being desired for two or more (and potentially all) recesses 110, however.

As described above, overcoat film 122 contains a photo-activated agent generator (e.g., a PAG) that generates, in response to actinic radiation 124, a solubility-changing agent 126 (e.g., acid) for changing the solubility of overcoat film 122 and/or fill material 120 to be soluble in one or more solvents (e.g., solvent 128) to be used in a subsequent removal process.

As shown in FIG. 4B (corresponding to stage 104d), overcoat film 122 is exposed to sufficient actinic radiation 124 for a sufficient time period to cause, where desired, the photo-activated agent generator (e.g., the PAG) in overcoat film 122 to generate solubility-changing agent 126 (e.g., acid) within overcoat film 122 such that overcoat film 122 now includes solubility-changing agent 126. In the example of FIG. 4B, actinic radiation 124 is a pattern of actinic radiation that is directed to overcoat film 122.

As described above, characteristics of actinic radiation 124 affect the amount of the photo-activated agent generator in overcoat film 122 that is activated. That is actinic radiation 124 having certain characteristics causes greater amounts of the photo-activated agent generator in overcoat film 122 to be activated, resulting in greater amounts of solubility-changing agent 126 being generated in those areas of overcoat film 122. Actinic radiation 124 having certain other characteristics causes lesser amounts of the photo-activated agent generator in overcoat film 122 to be activated, resulting in less solubility-changing agent 126 being generated in those areas of overcoat film 122. The amount of solubility-changing agent 126 in a particular area of overcoat film 122 affects how much solubility-changing agent 126 will be available for diffusion into fill material 120 in a subsequent heating step.

Thus, a pattern of actinic radiation 124 can be tailored to activate greater amounts of the photo-activated agent generator in overcoat film 122 overlying areas of fill material 120 where greater depth of diffusion of solubility-changing agent 126 and ultimately removal of fill material is desired and to activate lesser amounts of the photo-activated agent generator in overcoat film 122 overlying areas of fill material 120 where lesser depth of diffusion of solubility-changing agent 126 and ultimately removal of fill material is desired. Although use of a pattern of actinic radiation 124 to vary the depth of diffusion of solubility-changing agent 126 and ultimately remove of fill material 120 is described, the pattern of actinic radiation 124 could be designed to cause the photo-activated agent generator in overcoat film 122 to generate solubility-changing agent 126 in substantially equal amounts in one or more portions of overcoat film 122, such as when the target height 121 for fill material 120 in recesses 110 underlying those one or more portions of overcoat film 122 is substantially the equal.

In the example illustrated in FIG. 4B, the pattern of actinic radiation 124 is designed to cause the photo-activated agent generator in overcoat film 122 to generate a decreasing amount of solubility-changing agent 126 from overcoat film 122 over substrate portion 400a (the left side of FIG. 4A) to overcoat film 122 over substrate portion 400d (the right side of FIG. 4A), with little to no solubility-changing agent 126 being generated over recess 110 of substrate portion 400d (as no actinic radiation 124 is applied over substrate portion 400d). In certain embodiments, the ability to control activation of the photo-activated agent generator in overcoat film 122 and subsequent diffusion (e.g., by adjusting the exposure dose of actinic radiation 124) may be affected by a resolution limit of an exposure tool.

Figure 4C:
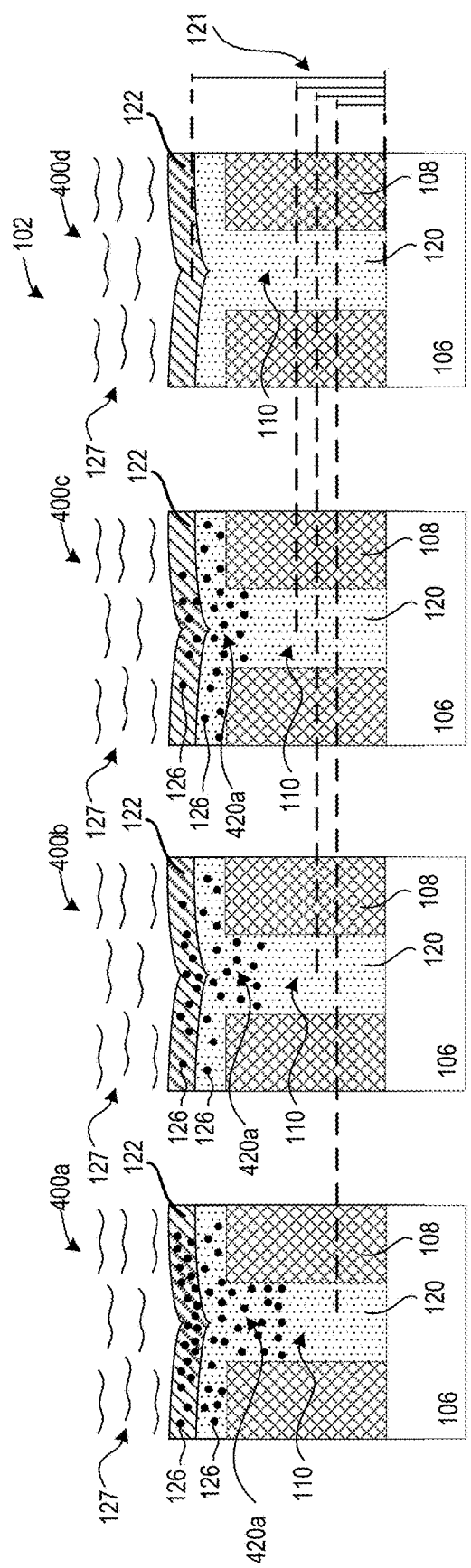

As shown in FIG. 4C (corresponding to stage 104e), to modify at least a portion of fill material 120 to be soluble in solvent 128, solubility-changing agent 126 has diffused into fill material 120, causing a portion (de-protected portion 420a) of fill material 120 to become soluble to solvent 128. De-protected portion 420a is generally shown as the portions of fill material 120 into which solubility-changing agent 126 has diffused. In certain embodiments, solubility-changing agent 126 is caused to diffuse into at least a portion of fill material 120 (creating de-protected portion 420a) using a thermal process (e.g., application of heat 12 for a suitable time period). In the example shown in FIG. 4C, solubility-changing agent 126 is diffused into recesses 110 at varying predetermined depths. Additionally, the predetermined depths in this example are insufficient to recess fill material 120 to target heights 121 of fill material 120 in recesses 110.

Figure 4D:
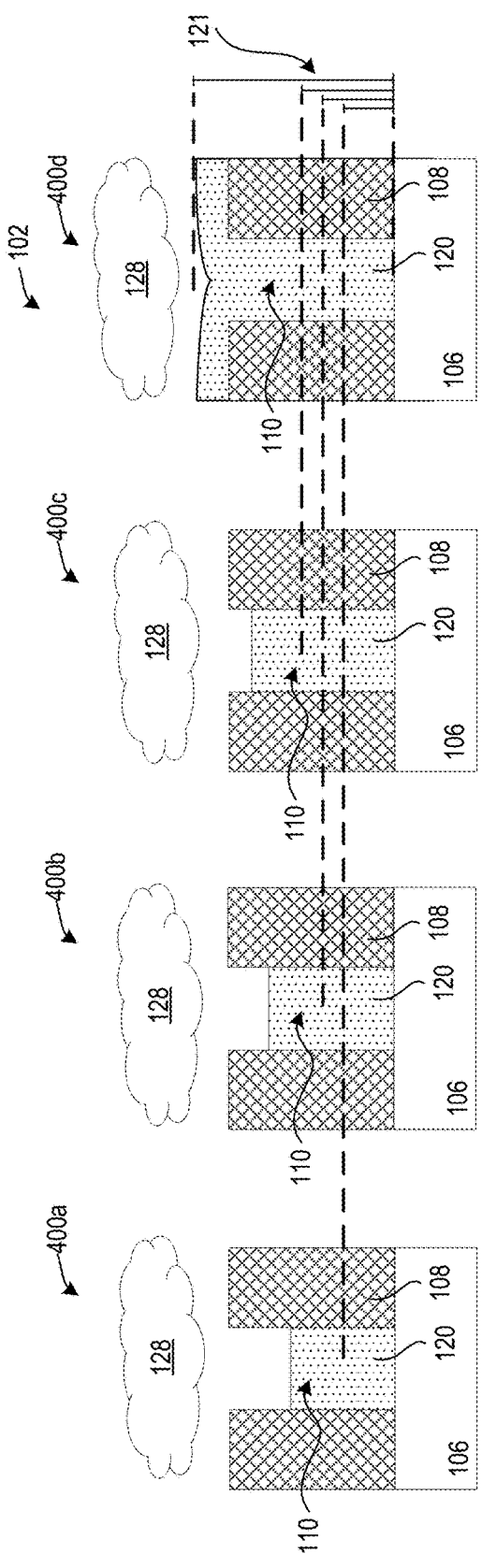

As illustrated in FIG. 4D (corresponding to stage 104f), overcoat film 122 and de-protected portion 420a of fill material 120 have been removed. In certain embodiments, overcoat film 122 and de-protected portion 420a of fill material 120 are developed using solvent 128, causing overcoat film 122 and de-protected portion 420a of fill material 120 to be removed from substrate 400. Removal of overcoat film 122 and de-protected portion 420a of fill material 120 causes changes in height of fill material 120 in recesses 110 commensurate with exposure dose (e.g., the depth of diffusion of solubility-changing agent 126 into fill material 120, or the depth of de-protected portions 420a of fill material 120).

This process of depositing overcoat film 122, exposure to actinic radiation 124, diffusion via baking for a length of time, and subsequent development of de-protected portion 120a of fill material 120 is repeated until a cumulative depth of fill material 120 de-protection and development in each recess 110 reaches corresponding target heights 121. For example, FIGS. 4E-4H illustrate a second iteration of this cyclic process, which in this example is sufficient to achieve target heights 121 of fill material 120 in recesses 110. Additional or fewer iterations may be appropriate to remove sufficient fill material 120 to reach target heights 121 of fill material in recesses 110 in particular implementations. Furthermore, the predetermined depth of diffusion of solubility-changing agent 126 into fill material 120 and subsequent removal of a de-protected portion of fill material 120 may be the same from one iteration to the next (and potentially across all iterations) or may vary from one iteration to the next (and potentially across all iterations), according to particular needs.

In particular, as illustrated in FIG. 4E (corresponding to stage 104g), overcoat film 122 has again been deposited on substrate 400. Overcoat film 122 again contains a photo-activated agent generator (e.g., a PAG) that generates, in response to actinic radiation 124, a solubility-changing agent 126 (e.g., acid) for changing the solubility of the material of overcoat film 122 and/or fill material 120 to be soluble in solvents 128.

As illustrated in FIG. 4F (corresponding to stage 104h), overcoat film 122 is exposed to a pattern of actinic radiation 124, causing the photo-activated agent generator in overcoat film 122 to generate solubility-changing agent 126 within overcoat film 122 such that overcoat film 122 now includes solubility-changing agent 126 and causing overcoat film 122 to become solubilized (soluble in solvent 128). It should be understood that the pattern of actinic radiation 124 used in FIG. 4F might or might not be the same as the pattern of actinic radiation 124 used in FIG. 4B, depending on the desired predetermined depth of diffusion of solubility-changing agent 126 into fill material 120 in a subsequent processing step.

As illustrated in FIG. 4G (corresponding to stage 104i), solubility-changing agent 126 has diffused into fill material 120, causing a further portion (de-protected portion 420b) of fill material 120 to become soluble to solvent 128. De-protected portion 420b is generally shown as the portion of fill material 120 into which solubility-changing agent 126 has diffused. As described above, solubility-changing agent 126 may be diffused into fill material 120 using a thermal process (e.g., baking of substrate 400). In certain embodiments, solubility-changing agent 126 is diffused a predetermined depth into fill material 120 to modify the solubility of fill material 120 to the predetermined depth, and in this example, the predetermined depth is sufficient to de-protect fill material 120 to target heights 121 in recesses 110.

As illustrated in FIG. 4H (corresponding to stage 104j), overcoat film 122 and de-protected portion 420b of fill material 120 have been removed. In certain embodiments, overcoat film 122 and de-protected portion 420a of fill material 120 are developed using solvent 128, causing overcoat film 122 and de-protected portion 420a of fill material 120 to be removed from substrate 400. In this example, removal of overcoat film 122 and de-protected portion 120b of fill material 120 causes changes in height of fill material 120 in recesses 110 such that the remaining fill material 120 in recesses 110 is substantially at target heights 121.

Subsequent processing may then be performed on semiconductor substrate 400. For example, process 102 may be integrated into a process for forming a semiconductor device using a variety of deposition and etch processes.

Process 102 may provide one or more technical advantages. For example, removing fill material 120 by creating de-protected portions of fill material 120 using a solubility-changing agent 126 that is generated from a photo-activated agent in an overcoat film 122 may provide a precise way to change the height of fill material 120. As another example, the ability to direct a pattern of actinic radiation 124 toward overcoat film 122 may allow fill material 120 to be removed at differing precise depths within one or more of recesses 110, and ultimately allow different target heights 121 to be reached.

Figure 5C:
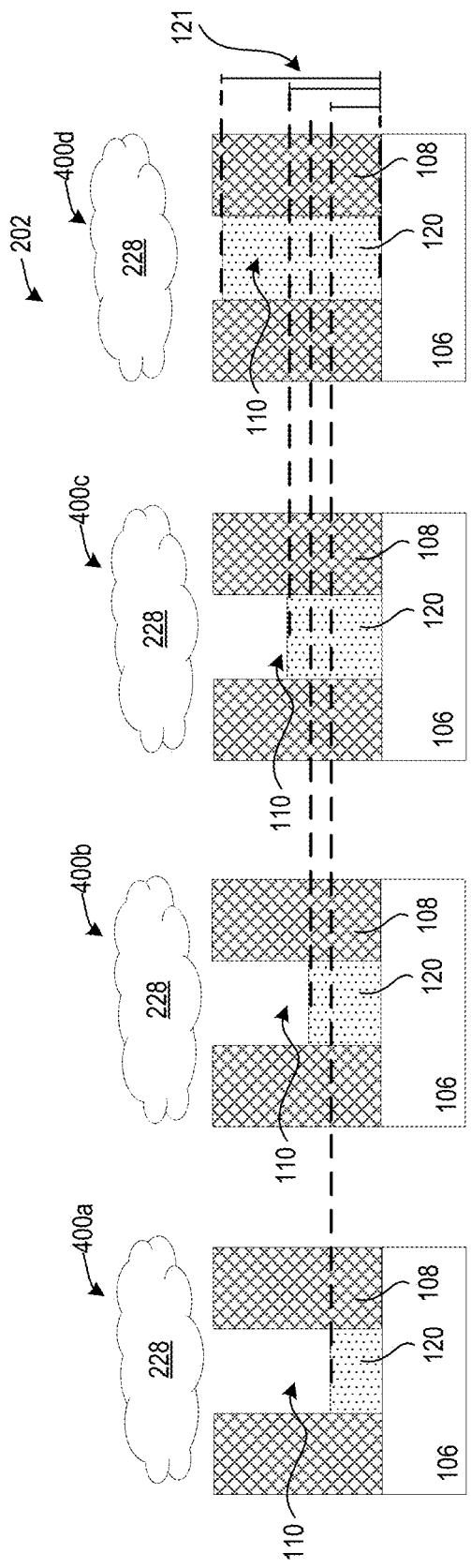

FIGS. 5A-5C illustrate cross-sectional views of example substrate portions 400a-400d having pre-patterned features during portions of example process 202 (described above with reference to FIGS. 2A-1I) for processing substrate portions 400a-400d, according to certain embodiments. In certain embodiments, process 202 includes one or more iterations of performing a PAG-based process to establish potentially varying heights (by removing fill material 120 to varying depths in recesses 110) of fill material 120 on various substrate portions 400a-400d and one or more subsequent iterations of performing a TAG-based process to potentially uniformly remove portions of fill material 120 on various substrate portions 400a-400d. To the extent not repeated, details related to substrate 100, process 202, and substrate portions 400a-400d/substrate 400 described with reference to FIGS. 2A-2I and/or FIGS. 4A-4H (or elsewhere) are incorporated by reference.

Rather than beginning at stage 202a of process 202, FIG. 5A begins at a step analogous to stage 204g of FIG. 2G. That is, FIG. 5A illustrates substrate 400 following at least one iteration of a PAG-based process to remove a portion of fill material 120 to varying predetermined depths within recesses 110, setting different relative heights of remaining fill material 120 in recesses 110. For example, just prior to the state of substrate 400 illustrated in FIG. 5A, substrate 400 may be in a state corresponding to FIG. 4D. FIGS. 5A-5C illustrate a TAG-based process, which may be performed one or more times, for removing additional portions of fill material 120 in recess 110 until target height 121 is reached.

As shown in FIG. 5A (corresponding to stage 204g), an overcoat film 222 has been deposited on substrate 400. Overcoat film 222 contains a thermally-activated agent generator (e.g., a TAG) that generates, in response to heat, solubility-changing agent 226 (e.g., acid) for changing the solubility of another material (e.g., the material of overcoat film 222 and/or fill material 120) to be soluble in solvent 228 to be used in a subsequent removal process.

As shown in FIG. 5B (corresponding to stage 204h), overcoat film 222 is exposed to sufficient heat 127 for a suitable time period to cause the thermally-activated agent generator (e.g., the TAG) in overcoat film 222 to generate solubility-changing agent 226 (e.g., acid) within overcoat film 222 such that overcoat film 222 now includes solubility-changing agent 226. The thermal process applied to (e.g., heating of) substrate 400 also causes solubility-changing agent 226 to diffuse a predetermined depth into fill material 120. Diffusion of solubility-changing agent 226 into fill material 120 modifies at least a portion (de-protected portion 520a) of fill material 120 to be soluble in solvent 228. De-protected portion 520a is generally shown as the portion of fill material 120 into which solubility-changing agent 226 has diffused.

In certain embodiments, solubility-changing agent 226 is diffused a predetermined depth into fill material 120 to modify the solubility of fill material 120 to the predetermined depth. The predetermined depth might or might not be sufficient to reach target heights 121 for fill material 120 in recesses 110. In the illustrated example, the predetermined depth is sufficient to recess fill material 120 to target heights 121 of fill material 120 in recesses 110. In embodiments in which the predetermined depth is insufficient to recess film material 120 to target heights 121 in recesses 110, one or more additional iterations of the process illustrated in FIGS. 5A-5C may be performed.

In certain embodiments, heat 127 is applied across substrate 400, and exposure to heat 12 may cause a substantially uniform amount of solubility-changing agent 226 to be generated within overcoat film 222. Furthermore, exposure to heat 127 may cause a substantially uniform depth of diffusion of solubility-changing agent 226 into fill material 120.

As shown in FIG. 5C (corresponding to stage 204i), overcoat film 222 and de-protected portion 420a of fill material 120 have been removed. In certain embodiments, overcoat film 222 and de-protected portion 420a of fill material 120 are developed using solvent 228, causing overcoat film 222 and de-protected portion 420a of fill material 120 to be removed from substrate 400. In this example, removal of overcoat film 122 and de-protected portion 120b of fill material 120 causes a change in height of fill material 120 in recess 110 such that the remaining fill material 120 in recesses 110 is substantially at target heights 121.

This process of depositing overcoat film 222, heating of substrate 400, and subsequent development of de-protected portion 520a of fill material 120 is repeated until a cumulative depth of fill material 120 de-protection and development in recesses 110 reaches corresponding target heights 121. For example, FIGS. 5A-5C illustrate a first iteration of this cyclic process, which in this example is sufficient to achieve target heights 121 of fill material 120 in recesses 110. Additional or fewer iterations may be appropriate to remove sufficient fill material 120 to reach target heights 121 of fill material in recesses 110 in particular implementations. Furthermore, the predetermined depth of diffusion of solubility-changing agent 226 into fill material 120 and subsequent removal of a de-protected portion of fill material 120 may be the same from one iteration to the next (potentially across all iterations) or may vary from one iteration to the next (potentially across all iterations), according to particular needs.

Subsequent processing may then be performed on semiconductor substrate 400. For example, process 202 may be integrated into a process for forming a semiconductor device using a variety of deposition and etch processes.

Process 202 may provide one or more technical advantages, which may be in addition to advantages described above with reference to process 102. In certain embodiments, recess 110 has a high aspect ratio (e.g., the difference between height 116 and height 114 is significantly larger than width 118), which can impede a path for the wavelength of light (the actinic radiation 124) suitable for activating the photo-activated agent generator in overcoat film 122 to reach the photo-activated acid generator in overcoat film 122 for activation. In general, a PAG-based process may begin encountering difficulties in activating the PAG in overcoat film 122 when the lateral dimension of the feature (e.g., recess 110) is much less than the wavelength of the impinging radiation. The greater the aspect ratio of the feature (e.g., recess 110) and thereby the depth in which the photons of actinic radiation 124 are to interact with overcoat film 122, the lower the efficiency of photon interaction within the feature at a given dimension less than the incoming wavelength of actinic radiation 124. As just one example, width 118 of the gap between structures 108 could be about 20 nm and a depth of recess 110 could be about five times that or more. A thermally-activated agent generator in overcoat film 222, which is activated by heat 127 rather than actinic radiation 124, does not rely on a particular wavelength of light and generates a substantially uniform amount of solubility-changing agent 226 in response to sufficient heat.

In process 202, one or more iterations of a PAG-based process may be performed to establish relative differences in target heights 121 in recesses 110 based on locations of recesses 110, while one or more subsequent iterations of the TAG-based process may be performed to substantially uniformly continue recessing fill material 120 in recesses 110 until target heights 121 are reached, while maintaining the relative differences in target heights 121 established using the one or more iterations of the PAG-based process. Furthermore, the TAG-based process is particularly efficient, as the thermal process used to activate the thermally-activated agent generator to generate solubility-changing agent 226 also causes solubility-changing agent 226 to diffuse the predetermined depth into fill material 120 without using a separate step (and potentially a separate tool) for exposure to actinic radiation 124.

Figure 6:
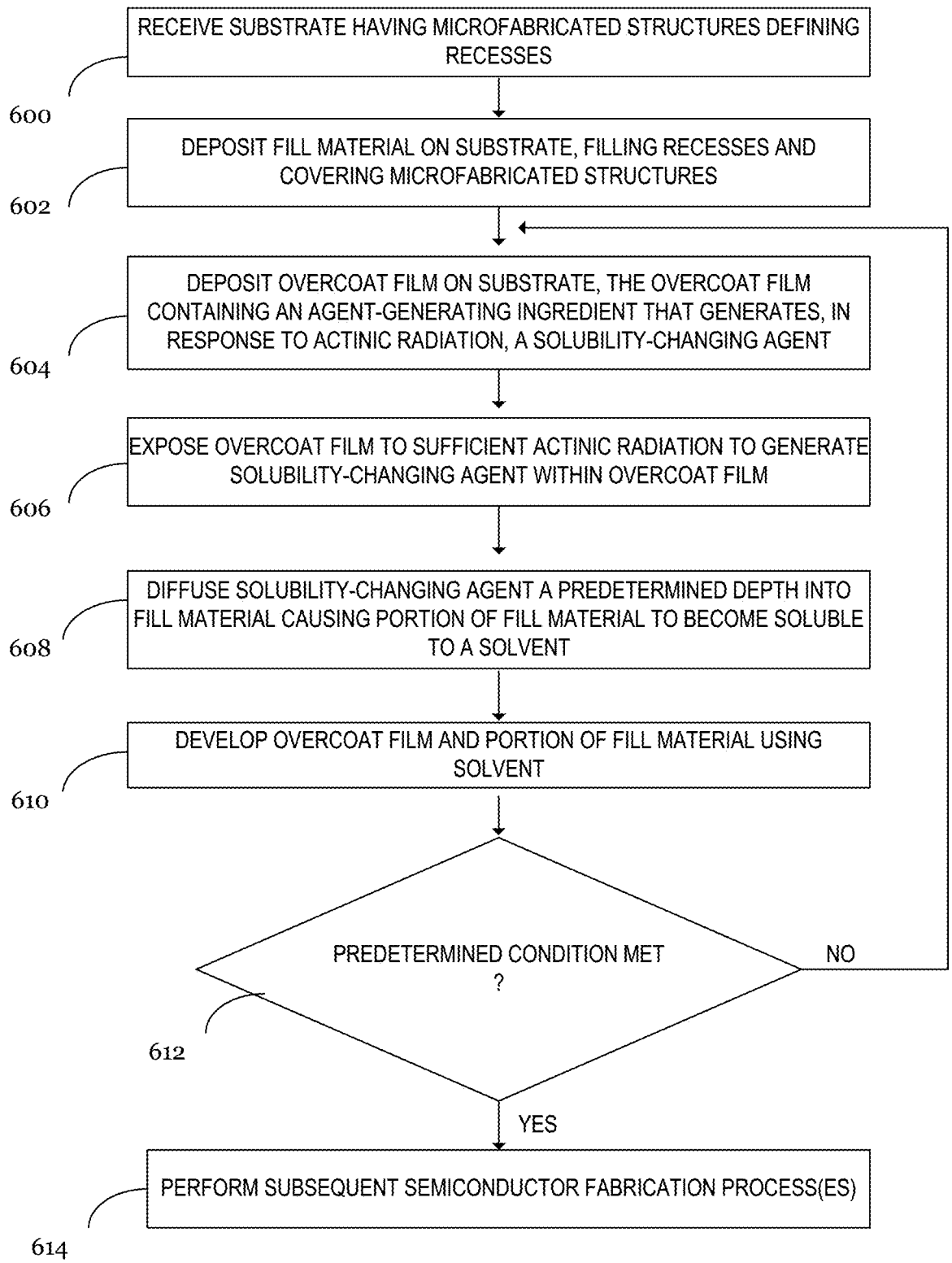
FIG. 6 illustrates an example method for processing a semiconductor substrate.

FIG. 6 illustrates an example method for processing a semiconductor substrate, according to certain embodiments. In general, the method described with reference to FIG. 6 corresponds to process 102 described above with reference to FIGS. 1A-1J and 4A-H.

At step 600, a substrate 100/400 having microfabricated structures 108 defining recesses 110 is received. At step 602, fill material 120 is deposited on substrate 100/400, filling recesses 110 and covering microfabricated structures 108. Fill material 120 may be a resin, and is initially resistant to development by a solvent 128. At step 604, overcoat film 122 is deposited on substrate 100/400. Overcoat film 122 contains a photo-activated agent generator (e.g., a PAG) that generates, in response to actinic radiation, a solubility-changing agent 126 (e.g., acid).

At step 606, overcoat film 122 is exposed to sufficient actinic radiation 124 to cause the photo-activated agent generator in overcoat film 122 to generate solubility-changing agent 126 within overcoat film 122. Actinic radiation 124 may be a pattern of actinic radiation 124 directed at substrate 100/400 and designed to achieve variation in predetermined depths of removal (and ultimately remaining heights of) fill material 120 in recesses 110. At step 608, solubility-changing agent 126 is diffused a predetermined depth into fill material 120, causing de-protected portion 120a/420a of fill material 120 to become soluble to solvent 128. This may include multiple different predetermined depths across substrate 100/400. In certain embodiments, substrate 100/400 is baked (or otherwise heated) to cause solubility-changing agent 126 to diffuse the predetermined depth into fill material 120. At step 610, overcoat film 122 and de-protected portion 120a/420a of fill material 120 is developed using solvent 128.

At step 612, a determination is made regarding whether a predetermined condition is met. In general, the determination made at step 612 relates to whether target heights 121 of fill material 120 in recesses 110 have been achieved. For example, the predetermined condition may include determining whether a predetermined number of cycles of steps 604-610 have been performed, the predetermined number of cycles having been predetermined to be sufficient to achieve target heights 121 of fill material 120 in recesses 110. As another example, the predetermined condition may include a real-time analysis of substrate 100/400 to determine whether target heights 121 of fill material 120 in recesses 110 have been achieved.

If a determination is made at step 612 that the predetermined condition is not met, then the method returns to step 604 to perform another cycle of steps 604-610. If a determination is made at step 612 that the predetermined condition has been met, then the method proceeds to step 614, with target heights 121 of fill material 120 in recesses 110 having been achieved. At step 614, subsequent semiconductor fabrication processes may be performed.

Figure 7:
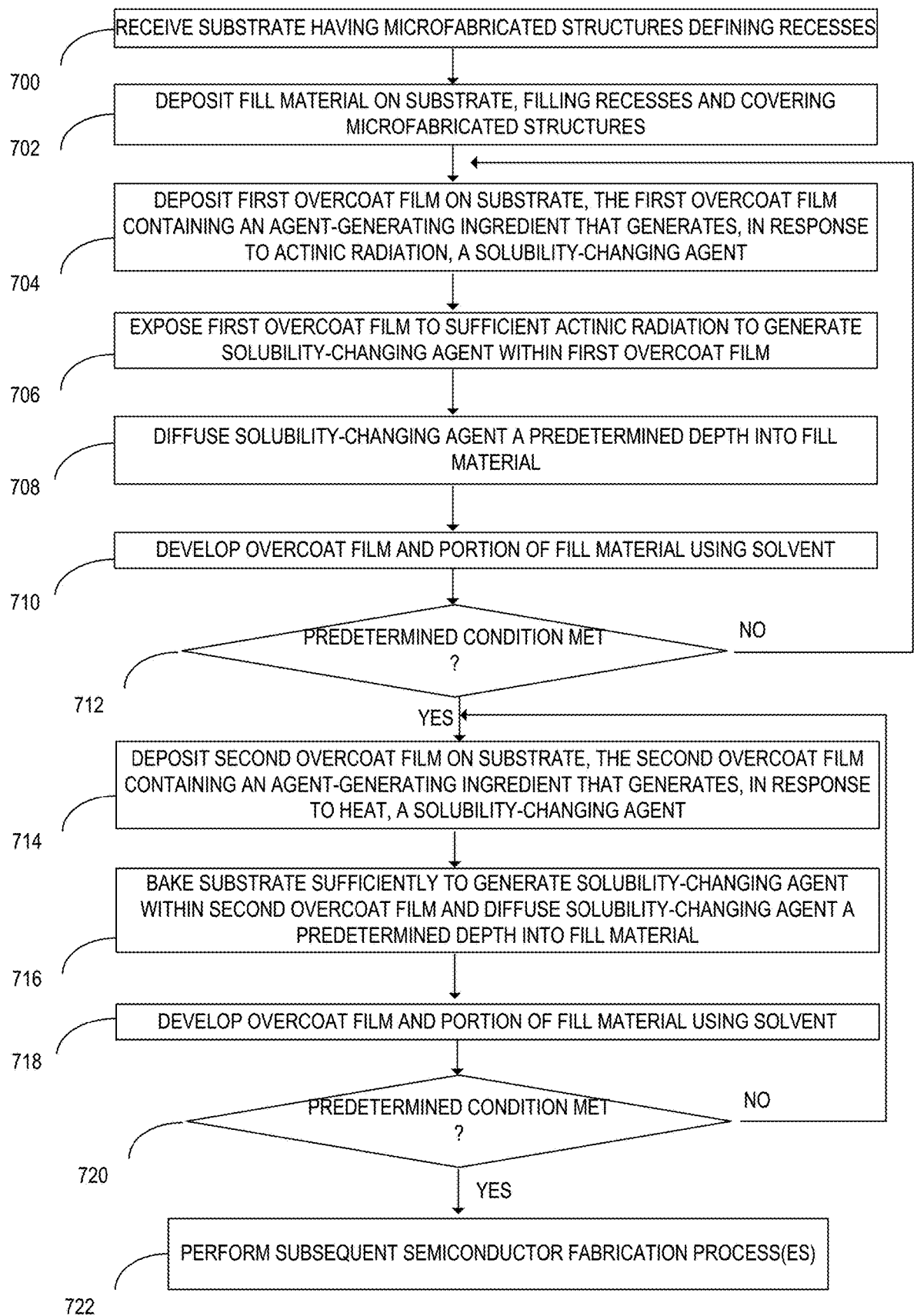
FIG. 7 illustrates an example method for processing a semiconductor substrate.

FIG. 7 illustrates an example method for processing a semiconductor substrate, according to certain embodiments. In general, the method described with reference to FIG. 7 corresponds to process 202 described above with reference to FIGS. 2A-2I and 5A-5C.

Steps 700-710 generally correspond to steps 600-610 of the method described with respect to FIG. 6; thus, the details of steps 600-610 are incorporated by reference and not repeated. At step 712, a determination is made regarding whether a predetermined condition is met. For example, the predetermined condition may include determining whether a predetermined number of cycles of steps 704-710 have been performed. In certain embodiments, the predetermined condition is whether a single cycle of steps 704-710 (e.g., the PAG-based process) has been performed; however, this disclosure contemplates multiple cycles of steps 704-710 (e.g., the PAG-based process) being performed prior to advancing to step 714.

If a determination is made at step 712 that the predetermined condition is not met, then the method returns to step 704 to perform another cycle of steps 704-710 (e.g., the PAG-based process). If a determination is made at step 712 that the predetermined condition has been met, then the method proceeds to step 714. At step 714, overcoat film 222 is deposited on substrate 100/400. Overcoat film 222 contains a thermally-activated agent generator (e.g., a TAG) that generates, in response to heat, a solubility-changing agent 226 (e.g., acid). At step 716, substrate 100/400 is baked sufficiently to generate solubility-changing agent 226 within overcoat film 222, and to diffuse solubility-changing agent 226 a predetermined depth into fill material 120, causing a portion (e.g., de-protected portion 220a/520a) of fill material 120 to become soluble to solvent 228. At step 718, overcoat film 122 and de-protected portion 220a/520a of fill material 120 is developed using solvent 228.

At step 720, a determination is made regarding whether a predetermined condition is met. In general, the determination made at step 720 relates to whether target heights 121 of fill material 120 in recesses 110 have been achieved, and may be analogous to the predetermined condition described above at step 612 of FIG. 6. If a determination is made at step 720 that the predetermined condition is not met, then the method returns to step 714 to perform another cycle of steps 714-718. If a determination is made at step 720 that the predetermined condition has been met, then the method proceeds to step 722, with target heights 121 of fill material 120 in recesses 110 having been achieved. At step 722, subsequent semiconductor fabrication processes may be performed.

Figure 8:
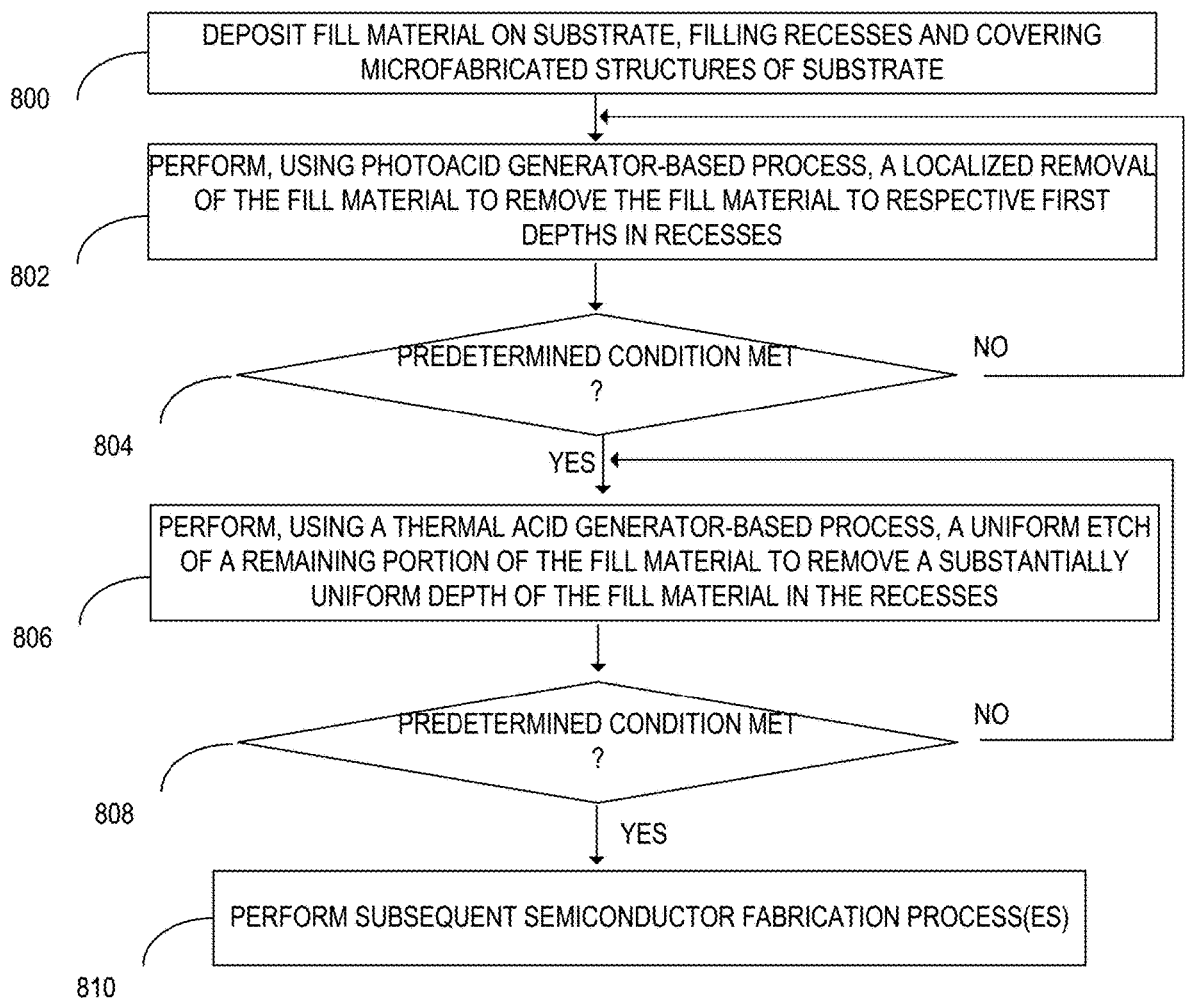
FIG. 8 illustrates an example method for processing a semiconductor substrate.

FIG. 8 illustrates an example method for processing a semiconductor substrate, according to certain embodiments. At step 800, fill material 120 is deposited on substrate 100/400, filling recesses 110 and covering microfabricated structures 108 of substrate 100/400. At step 802, using a PAG-based process, a localized removal of fill material 120 is performed to remove fill material 120 to respective first depths in recesses 110. At step 804, a determination is made regarding whether a predetermined condition is met. For example, the predetermined condition may include determining whether a predetermined number of cycles of step 802 have been performed. In certain embodiments, the predetermined condition is whether a single cycle of step 802 has been performed; however, this disclosure contemplates multiple cycles of step 802 being performed prior to advancing to step 806. If a determination is made at step 804 that the predetermined condition is not met, then the method returns to step 802 to perform another cycle of step 802. If a determination is made at step 804 that the predetermined condition has been met, then the method proceeds to step 806.

At step 806, using a TAG-based process, a uniform etch of a remaining portion of fill material 120 is performed to remove a substantially uniform depth of fill material 120 in recesses 110. At step 808, a determination is made regarding whether a predetermined condition is met. In general, the determination made at step 808 relates to whether target heights 121 of fill material 120 in recesses 110 have been achieved, and may be analogous to the predetermined condition described above at step 612 and 720 of FIGS. 6 and 7, respectively. If a determination is made at step 808 that the predetermined condition is not met, then the method returns to step 806 to perform another cycle of step 806. If a determination is made at step 808 that the predetermined condition has been met, then the method proceeds to step 810, with target heights 121 of fill material 120 in recesses 110 having been achieved. At step 810, subsequent semiconductor fabrication processes may be performed.

Figure 9A:
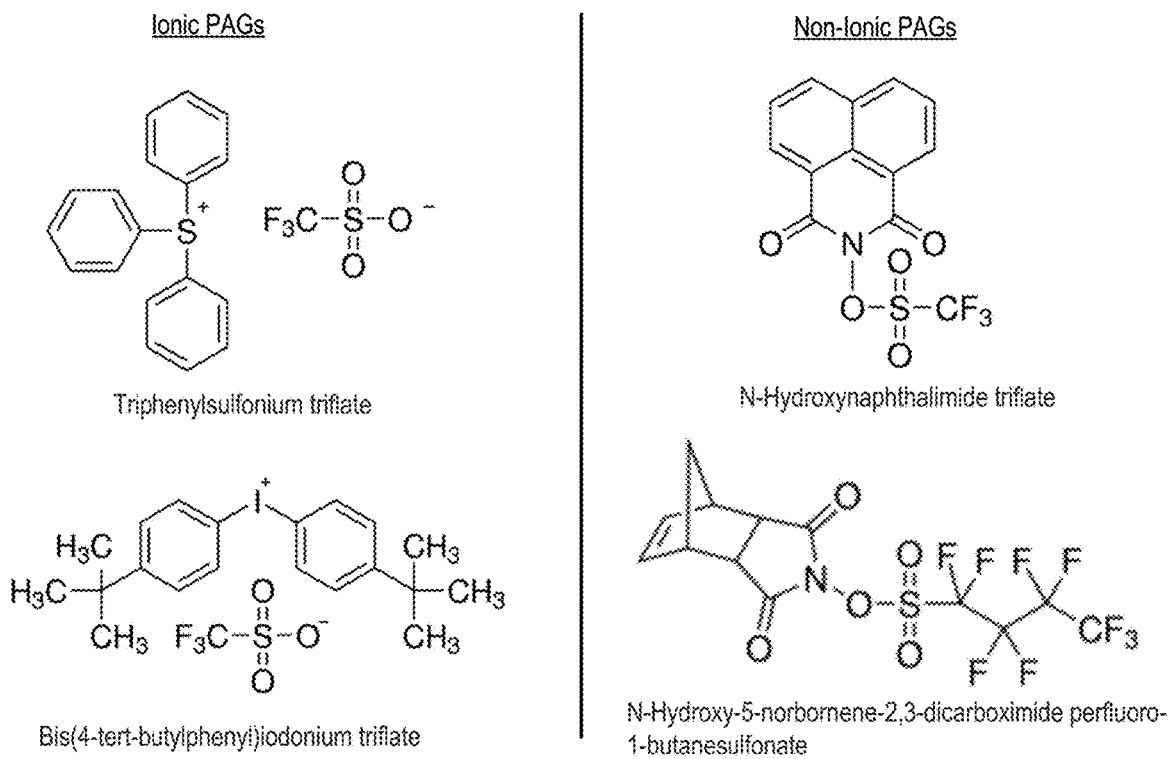
FIGS. 9A-9C illustrate example PAGs and TAGs that may be used in overcoat films.
Figure 9B:
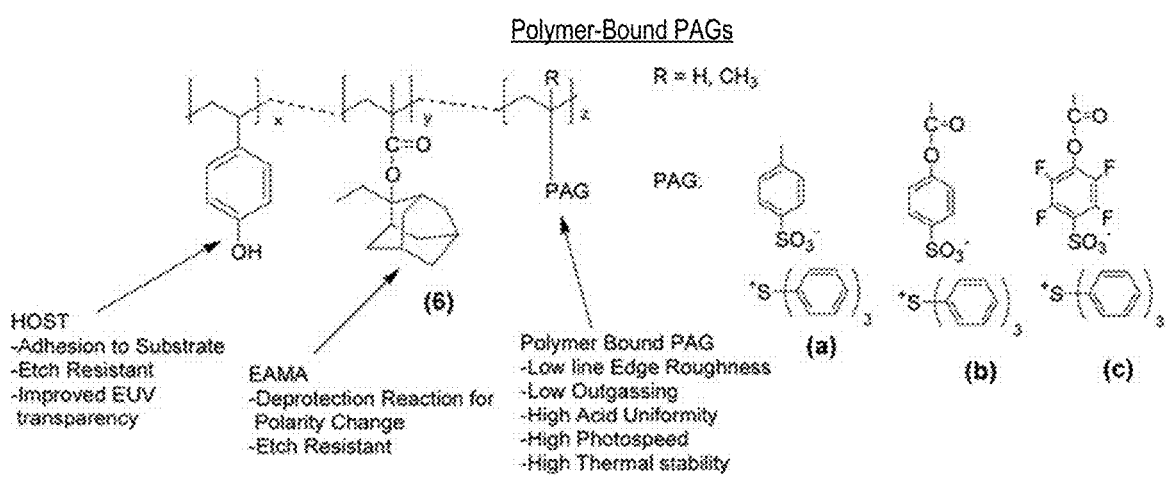
Figure 9C:
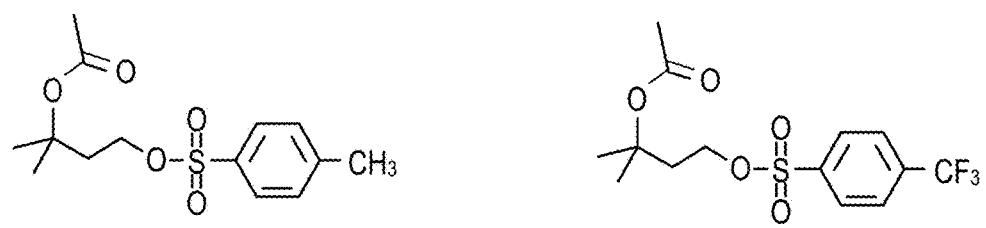

FIGS. 9A-9C illustrate example PAGs and TAGs that may be used in overcoat films 122/222, according to certain embodiments. FIG. 9A illustrates example ionic PAGs, including triphenylsulfonium triflate and Bis(4-tert-butylphenyl)iodonium triflate, that may be used as the photo-activated agent generator of overcoat film 122. FIG. 9A also illustrates example non-ionic PAGs, including N-Hydroxynaphthalimide triflate and N-Hydroxy-5-norbornene-2,3-dicarboximide perfluoro-1-butanesulfonate, that may be used as the photo-activated agent generator of overcoat film 122. In general, whether ionic or non-ionic, PAGs may decompose upon exposure to a specific wavelength (or range of wavelengths) of light, generating a strong acid. FIG. 9B illustrates example polymer-bound PAGs that may be used as the photo-activated agent generator of overcoat film 122. FIG. 9C illustrates example TAGs that may be used as the thermally-activated agent generator of overcoat film 222. These TAGs may decompose at elevated temperatures, generating a strong acid. In certain embodiments, TAGs may include sulfonate esters, onium salts or halogen-containing compounds to name just a few examples.

Figure 10A:
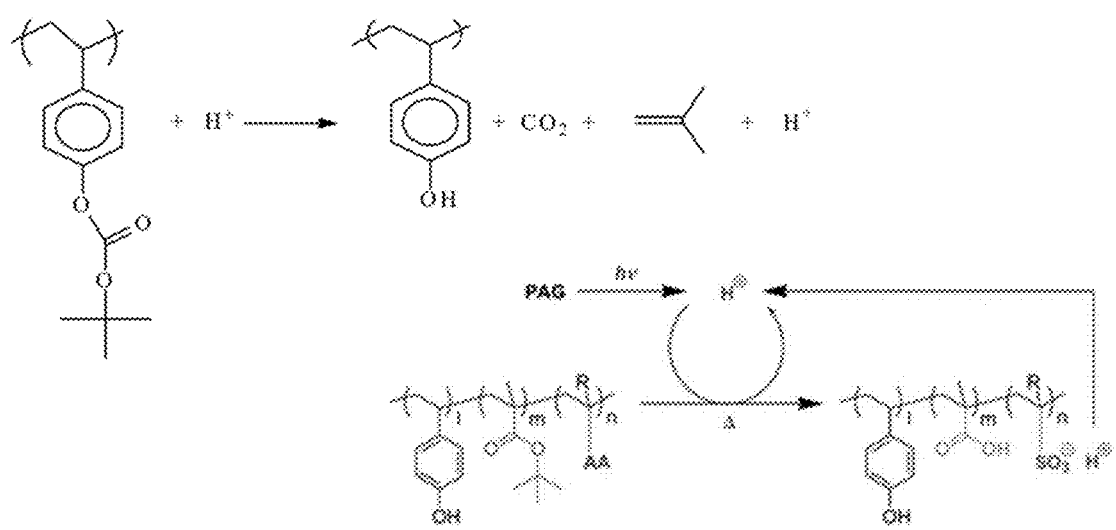
FIGS. 10A-10B illustrate example modification of the solubility of overcoat films and/or a fill material.
Figure 10B:
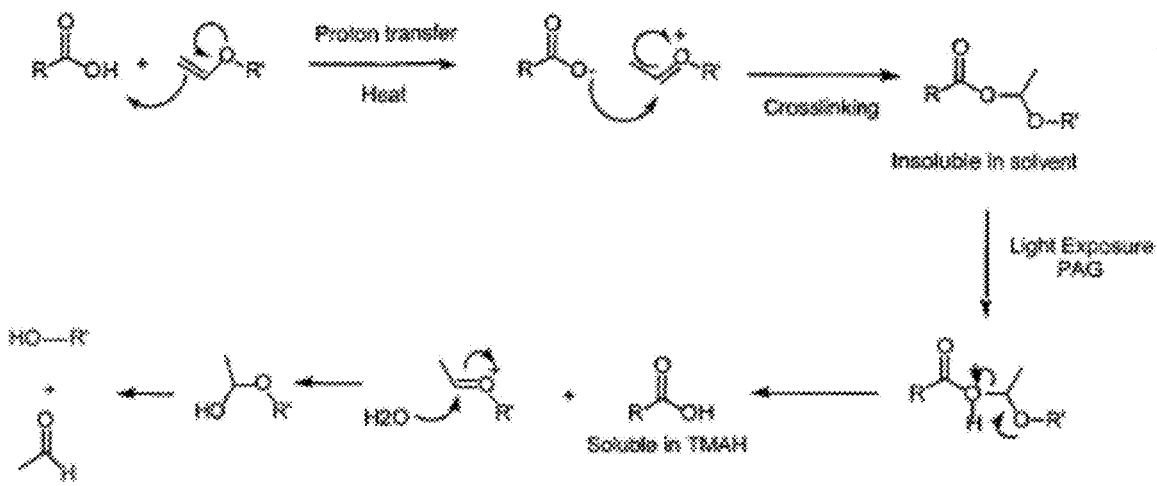

FIGS. 10A-10B illustrate example modification of the solubility of overcoat films 122/222 and/or fill material 120. In particular, FIGS. 10A-10B illustrate polymer-solubility changing interactions with strong acid. FIG. 10A illustrates a tert-butoxycarbonyl (t-BOC) de-protection chemistry, which may be used in certain photoresists. The material t-BOC may be one of several monomers that make up the polymer of fill material 120 and/or overcoat films 122/222. In this example, the protected polymer is hydrophobic (t-butyl group), and the de-protected polymer is hydroxide, carboxylic acid. FIG. 10B illustrates a vinyl ether de-crosslinking, which may be used in certain developable bottom anti-reflective coatings (dBARCs). In certain embodiments, interaction with strong acid causes a de-crosslinking reaction to occur, making the reacted portion of the film (e.g., fill material 120 and/or overcoat films 122/222) more soluble in a given developer (e.g., solvent 128/228).

It should be understood that the example chemistries and systems described above with reference to FIGS. 9A-9C and 10A-10B are provided as examples only, and that this disclosure contemplates using any suitable chemistries and systems.

Although this disclosure has been described in the context of a particular microfabrication process (recessing a fill material 120 to target heights 121 within one or more recesses 110 in a substrate 100/400), this disclosure may be used with any suitable microfabrication process. For example, this disclosure contemplates using techniques described herein to control the height of any film or other structure/feature of a semiconductor device, whether or not such film or other structure/feature is wholly or partially in a recess.

Figure 11:
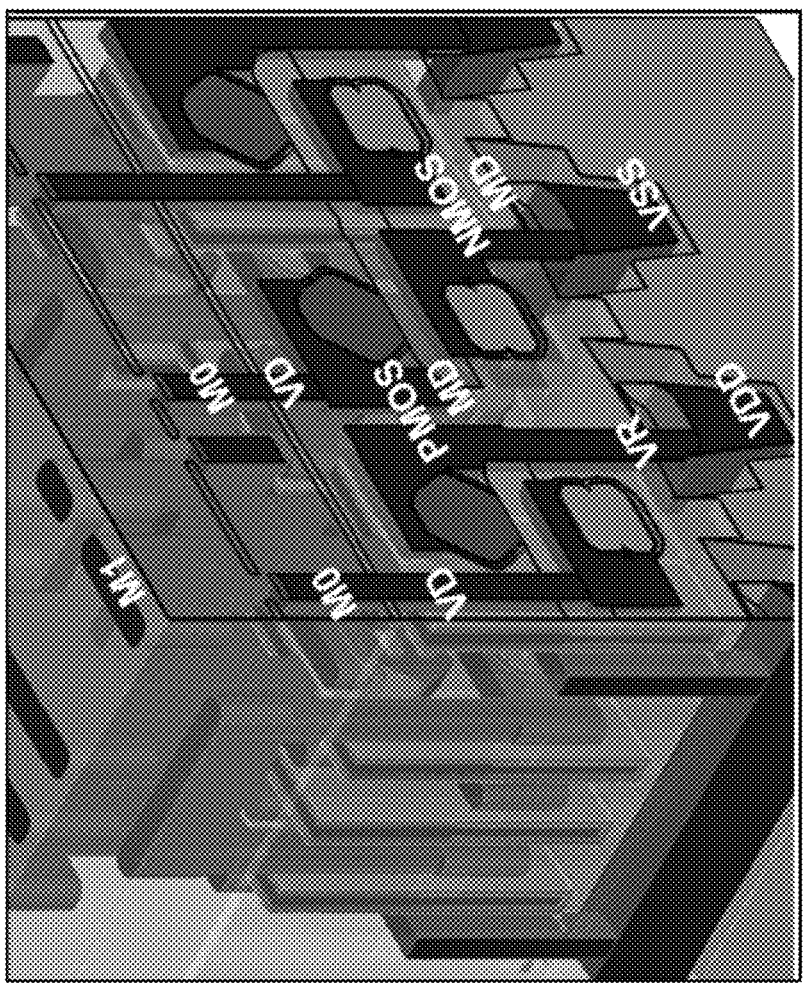
FIG. 11 illustrates examples of stacked transistor architectures that may benefit from precise film height control to selectively grow n-type and p-type silicon-germanium (SiGe)
Figure 11:
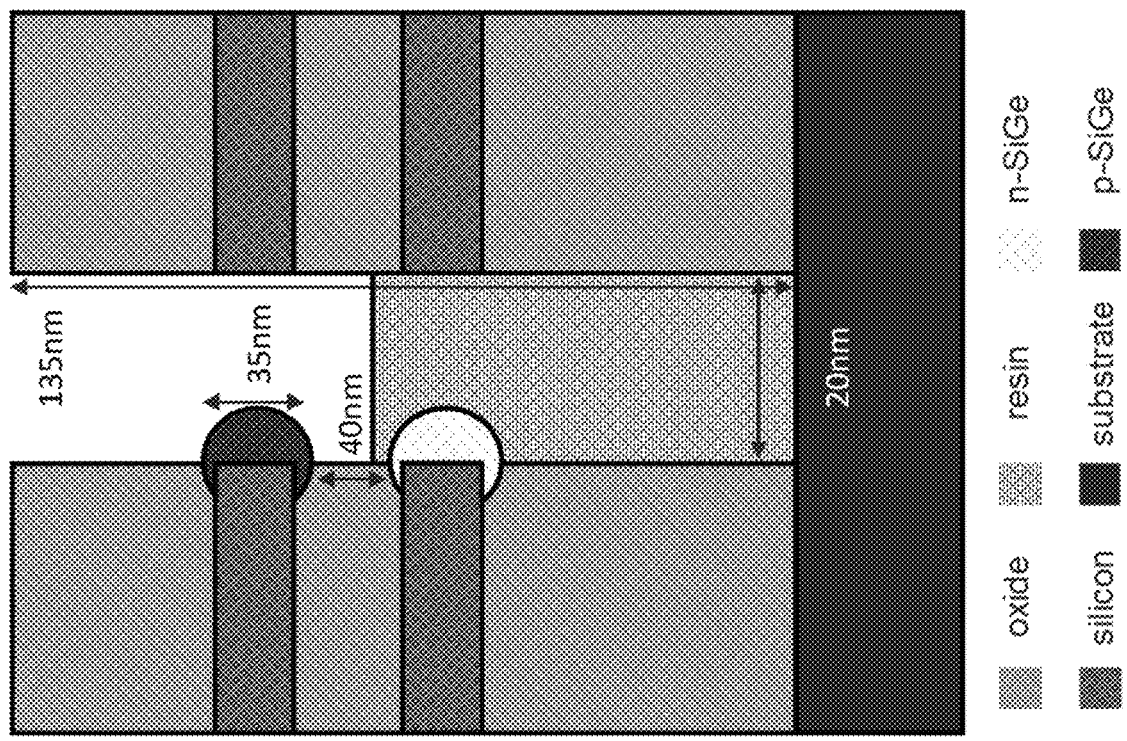

A specific example application of embodiments herein is the construction of three-dimensional transistor architectures in which n-type field effect transistors (NFETs) and p-type FETs (PFETs) are stacked on top of one another. This can include a vertical stack of lateral gate-all-around (GAA) transistors. Epitaxial silicon-germanium (SiGe) growth doped with electron-rich (n-type) species can occur at both upper and lower layers of uncovered silicon. The upper silicon layer, however, can be designed to have electron-deficient (p-type) SiGe. Therefore, after the n-type SiGe is grown, a corresponding feature is filled to a depth that will cover the lower silicon level while leaving the upper silicon level exposed (uncovered) for subsequent silicon etch and regrowth of p-type SiGe. Use of film height control embodiments herein may provide improved control and/or across-wafer uniformity of film height. FIG. 11 illustrates examples of stacked transistor architectures that may benefit from precise film height control to selectively grow both n-type and p-type SiGe.

Figure 12A:
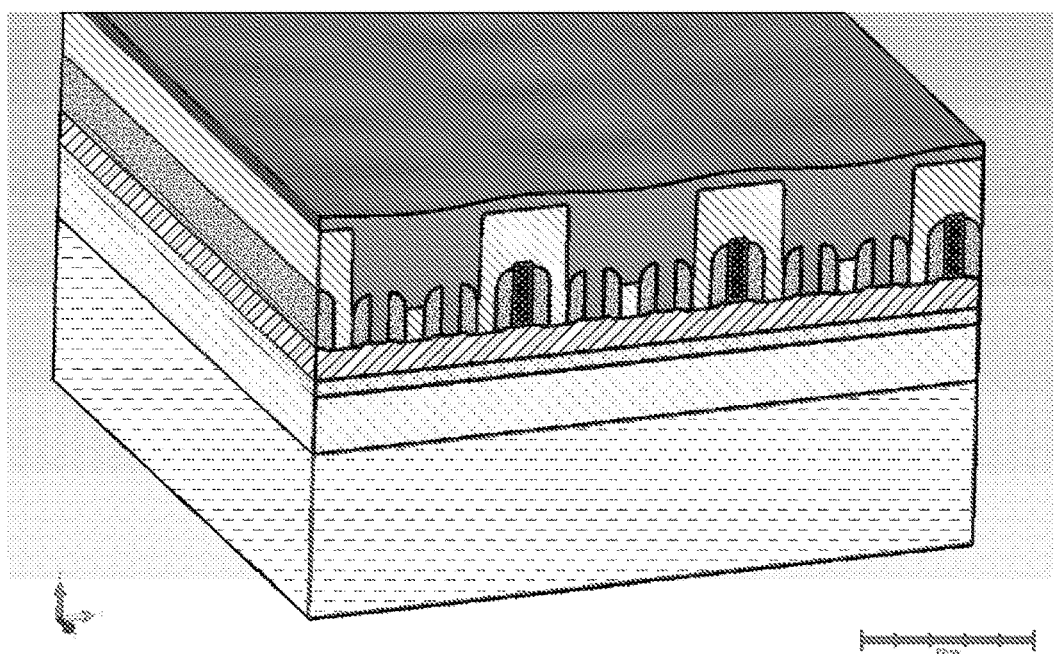
FIGS. 12A-12B illustrate that a step in a self-aligned block (SAB) process flow may benefit from a partial recess of a specific film, such as a spin-on carbon.
Figure 12A:
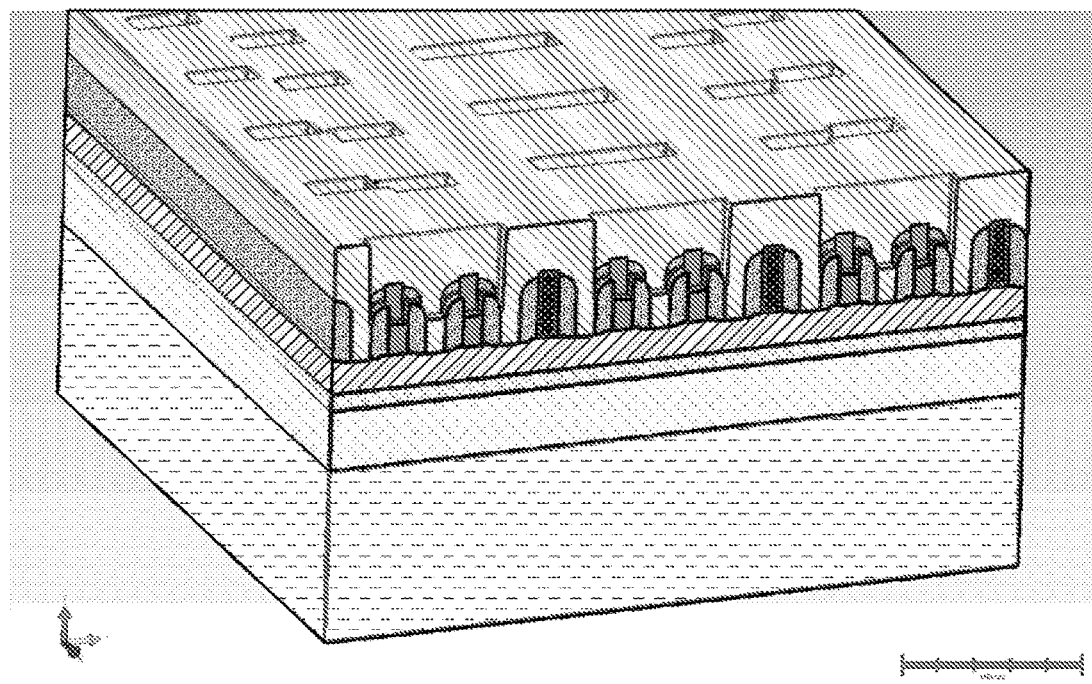
Figure 12B:
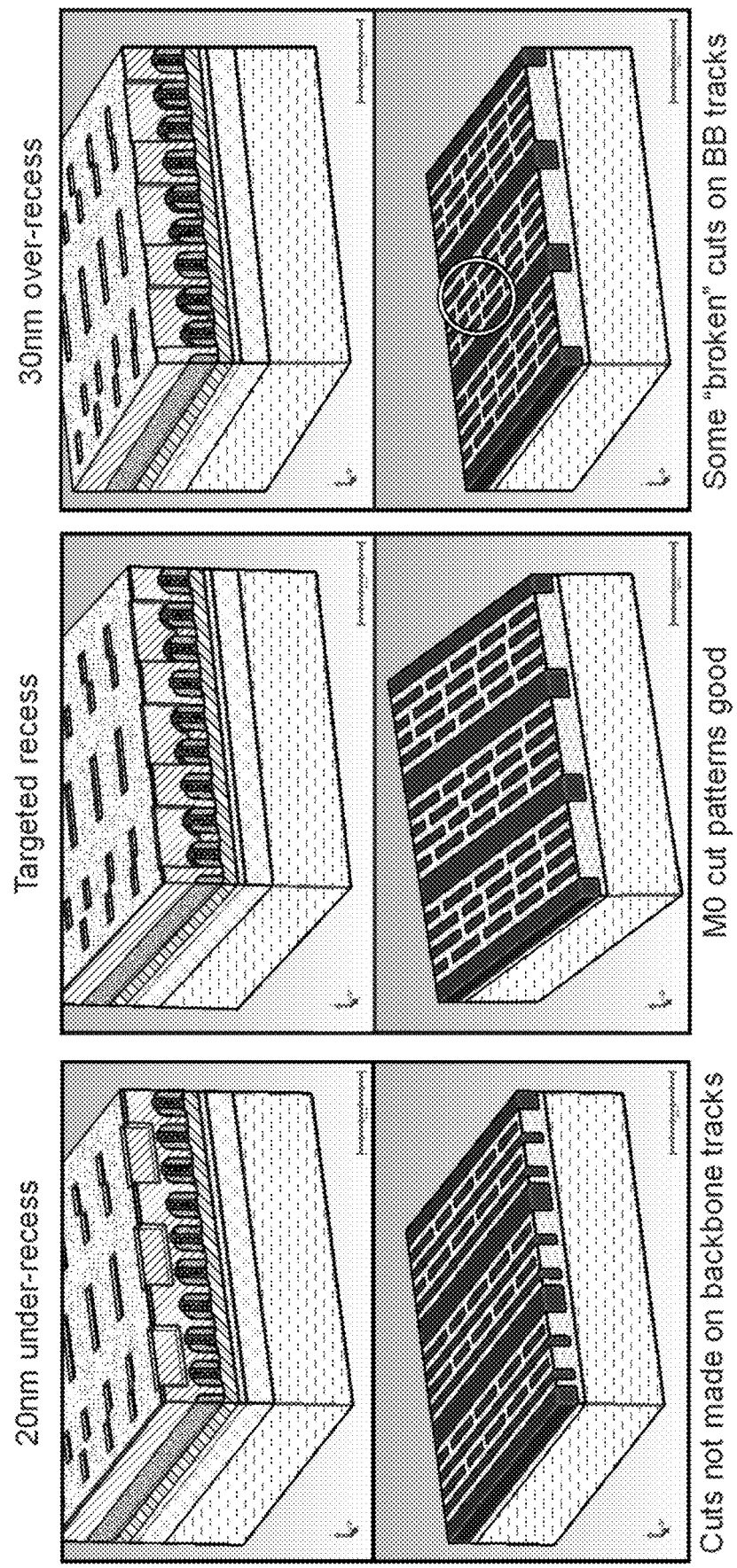

The process of SAB is a method to pattern dense features at advanced processing nodes. A step in the SAB process flow may benefit from a partial recess of a specific film, such as a spin-on carbon film as illustrated in FIGS. 12A-12B. If this film is over or under etched relative to the surrounding spacers by even a small margin, the final pattern in the process flow might not be transferred correctly, resulting in a failure. Techniques herein provide a highly planar surface across potentially the entirety of a wafer, which may improve the control and reproducibility of the SAB process.

Various techniques have been described as multiple discrete operations to assist in understanding the various embodiments. The order of description should not be construed as to imply that these operations are necessarily order dependent. Operations described may be performed in a different order than the described embodiment. Various additional operations may be performed and/or described operations may be omitted in additional embodiments.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for processing a semiconductor substrate, the method comprising:
receiving a substrate having microfabricated structures defining recesses;
depositing a resin film on the substrate, the resin film filling the recesses and covering the microfabricated structures, the resin film being initially resistant to development by a first solvent;
depositing a first overcoat film on the substrate, the first overcoat film containing a first agent-generating ingredient that generates, in response to actinic radiation, a first solubility-changing agent;
exposing the first overcoat film to first sufficient actinic radiation to generate the first solubility-changing agent within the first overcoat film;
diffusing the first solubility-changing agent a first predetermined depth into the resin film causing a first portion of the resin film to become soluble to the first solvent;
developing the first overcoat film and the first portion of the resin film using the first solvent;
depositing a second overcoat film on the substrate, the second overcoat film containing the first agent-generating ingredient that generates, in response to actinic radiation, the first solubility-changing agent;
exposing the second overcoat film to second sufficient actinic radiation to generate the first solubility-changing agent within the second overcoat film;
diffusing the first solubility-changing agent a second predetermined depth into the resin film causing a second portion of the resin film to become soluble to the first solvent; and
developing the second overcoat film and the second portion of the resin film using the first solvent resulting in the resin film being recessed respective first combined depths in the recesses.

2. The method of claim 1, wherein diffusing the first solubility-changing agent the first predetermined depth into the resin film comprises heating the substrate.

3. The method of claim 1, wherein:
diffusing the first solubility-changing agent a second predetermined depth into the resin film causing a second portion of the resin film to become soluble to the first solvent comprises:
diffusing the first solubility-changing agent a first depth into a first recess of the recesses; and
diffusing the first solubility-changing agent a second depth into a second recess of the recesses, the first depth being greater than the second depth; and
developing the second portion of the resin film using the first solvent results in the resin film being recessed a greater first combined depth in the first recess than the first combined depth in the second recess.

4. The method of claim 1, wherein the first agent-generating ingredient comprises a photoacid generator.

5. The method of claim 1, wherein the first sufficient actinic radiation and the second sufficient actinic radiation have substantially similar characteristics.

6. The method of claim 1, further comprising:
depositing a third overcoat film on the substrate, the third overcoat film containing a second agent-generating ingredient that generates, in response to heating of the substrate, a second solubility-changing agent;
heating the substrate sufficiently to generate the second solubility-changing agent within the second overcoat film and diffuse the second solubility-changing agent a third predetermined depth into the resin film causing a third portion of the resin film to become soluble to the first solvent; and
developing the third portion of the resin film using the first solvent resulting in the resin film being recessed respective second combined depths in the recesses.

7. The method of claim 1, wherein:
developing the first overcoat film and the first portion of the resin film using the first solvent removes the first overcoat film and the first portion of the resin film; and
developing the second overcoat film and the second portion of the resin film using the first solvent removes the second overcoat film and the second portion of the resin film.

8. A method for processing a semiconductor substrate, the method comprising:
receiving a substrate having microfabricated structures defining recesses;
depositing a resin film on the substrate, the resin film filling the recesses and covering the microfabricated structures, the resin film being initially resistant to development by a first solvent;
depositing a first overcoat film on the substrate, the first overcoat film containing a first agent-generating ingredient that generates, in response to actinic radiation, a first solubility-changing agent;
exposing the first overcoat film to sufficient actinic radiation to generate the first solubility-changing agent within the first overcoat film;
diffusing the first solubility-changing agent a first predetermined depth into the resin film causing a first portion of the resin film to become soluble to the first solvent;
developing the first portion of the resin film using the first solvent;
depositing a second overcoat film on the substrate, the second overcoat film containing a second agent-generating ingredient that generates, in response to heating of the substrate, a second solubility-changing agent;
baking the substrate sufficiently to generate the second solubility-changing agent within the second overcoat film and diffuse the second solubility-changing agent a second predetermined depth into the resin film causing a second portion of the resin film to become soluble to the first solvent; and
developing the second portion of the resin film using the first solvent resulting in the resin film being recessed respective combined depths in the recesses.

9. The method of claim 8, further comprising cyclically removing additional portions of the resin film until the resin film is a respective predetermined thickness in the recesses.

10. The method of claim 8, wherein:
a width of at least one of the recesses is about 20 nm or less; and
a depth of the at least one of the recesses prior to deposition of the resin film on the substrate is at least five times the width of the at least one of the recesses.

11. The method of claim 8, wherein:
the first agent-generating ingredient comprises a photoacid generator; and
the second agent-generating ingredient comprises a thermal acid generator.

12. The method of claim 8, wherein:
developing the first overcoat film and the first portion of the resin film using the first solvent removes the first overcoat film and the first portion of the resin film; and
developing the second overcoat film and the second portion of the resin film using the first solvent removes the second overcoat film and the second portion of the resin film.

13. A method for processing a semiconductor substrate, the method comprising:
depositing a resin film on a substrate, the substrate having microfabricated structures defining recesses, the resin film filling the recesses and covering the microfabricated structures;
performing, using a photoacid generator (PAG)-based process, a localized removal of the resin film to remove the resin film to respective first depths in the recesses, at least two depths of the respective first depths being different depths; and
repeatedly performing, using a thermal acid generator (TAG)-based process and until a predetermined condition is met, a uniform removal of a remaining portion of the resin film to remove a substantially uniform depth of the resin film in the recesses.

14. The method of claim 13, wherein the PAG-based process comprises:
depositing a first overcoat film on the substrate, the first overcoat film comprising a PAG;
exposing the first overcoat film to a first pattern of radiation to cause the PAG to generate a first acid within the first overcoat film according to the first pattern of radiation;
heating the substrate sufficiently to diffuse the first acid into the resin film to the respective first depths in the recesses, causing a first portion of the resin film to become soluble to a first solvent, the first portion extending to the respective first depths in the recesses; and
developing the first overcoat film and the first portion of the resin film using the first solvent to remove the resin film to the respective first depths in the recesses.

15. The method of claim 14, wherein the TAG-based process comprises:
depositing a second overcoat film on the substrate, the second overcoat film comprising TAG;
heating the substrate sufficiently to cause the TAG to generate a second acid within the second overcoat film and to diffuse the second acid a second depth into remaining portions of the resin film causing a second portion of the resin film to become soluble to a second solvent; and
developing the second overcoat film and the second portion of the resin film using a second solvent resulting in the resin film being recessed a predetermined depth in the recesses defined by the microfabrication structures.

16. The method of claim 15, wherein the first solvent and the second solvent are a same type of solvent.

17. The method of claim 13, wherein performing, using the PAG-based process, the localized removal of the resin to remove the resin film to the respective first depths in the recesses comprises repeating the PAG-based process at least twice.

18. The method of claim 13, wherein meeting the predetermined condition comprises repeating the TAG-based process a predetermined number of times.

19. The method of claim 13, wherein repeatedly performing, using the TAG-based process and until the predetermined condition is met, the uniform removal of the remaining portion of the resin film comprises performing the TAG-based process once.

20. The method of claim 13, wherein meeting the predetermined condition comprises removing the resin film to respective predetermined depths in the recesses leaving respective heights of resin film in the recesses that correspond to respective predetermined heights.

21. The method of claim 13, wherein a concentration of TAG in an overcoat film is different on a first performance of the TAG-based process than on a subsequent performance of the TAG-based process.

* * * * *